(12) United States Patent
Jang et al.

(10) Patent No.: US 12,615,838 B2
(45) Date of Patent: Apr. 28, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shu-Uei Jang, Hsinchu (TW); Shih-Yao Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 560 days.

(21) Appl. No.: 18/170,440

(22) Filed: Feb. 16, 2023

(65) Prior Publication Data

US 2023/0197521 A1     Jun. 22, 2023

Related U.S. Application Data

(63) Continuation-in-part of application No. 17/460,583, filed on Aug. 30, 2021, now Pat. No. 12,046,597.

(60) Provisional application No. 63/430,929, filed on Dec. 7, 2022.

(51) Int. Cl.
| | |
|---|---|
| *H10D 84/03* | (2025.01) |
| *H10D 30/01* | (2025.01) |
| *H10D 64/01* | (2025.01) |
| *H10D 84/01* | (2025.01) |

(52) U.S. Cl.
CPC ......... *H10D 84/038* (2025.01); *H10D 30/024* (2025.01); *H10D 64/017* (2025.01); *H10D*

*84/0128* (2025.01); *H10D 84/0151* (2025.01); *H10D 84/0158* (2025.01)

(58) Field of Classification Search
CPC ............ H10D 84/038; H10D 84/0151; H10D 64/017; H10D 84/0158; H10D 30/024; H10D 84/0128
See application file for complete search history.

(56) References Cited

U.S. PATENT DOCUMENTS

| | | | |
|---|---|---|---|
| 2019/0386002 A1* | 12/2019 | Wu | ...................... H10D 64/017 |
| 2020/0075421 A1* | 3/2020 | Wu | ................... H01L 21/76877 |
| 2021/0126109 A1 | 4/2021 | Lin et al. | |
| 2021/0242093 A1 | 8/2021 | Lin et al. | |

(Continued)

*Primary Examiner* — Christine A Enad

(74) *Attorney, Agent, or Firm* — Foley & Lardner LLP

(57)     ABSTRACT

A method for fabricating semiconductor devices includes forming a first semiconductor channel structure and a second semiconductor channel structure over a substrate; forming a metal gate structure, wherein the metal gate structure includes a first portion and a second portion straddling the first semiconductor channel structure and the second semiconductor channel structure, respectively; replacing a third portion of the metal gate structure between the first portion and the second portion with a first dielectric material to form a gate isolation structure, wherein a width of the gate isolation structure along the second direction decreases with an increasing depth of the gate isolation structure toward the substrate; and replacing a portion of the gate isolation structure, the second portion of the metal gate structure, and the second semiconductor channel structure with a second dielectric material to form an edge isolation structure.

20 Claims, 19 Drawing Sheets

(56)          References Cited

U.S. PATENT DOCUMENTS

| | | |
|---|---|---|
| 2022/0328357 A1 | 10/2022 | Lin et al. |
| 2024/0021480 A1 | 1/2024 | Chiang et al. |

* cited by examiner

SEMICONDUCTOR DEVICES AND METHODS OF MANUFACTURING THEREOF

CROSS-REFERENCE TO RELATED APPLICATION

This application is related to and claims priority under 35 U.S. § 120 as a continuation-in-part of U.S. Utility Application No. 17/460,583, filed on Aug. 30, 2021, titled "FIN FIELD-EFFECT TRANSISTOR AND METHOD OF FOMRING THE SAME," which claims priority to and the benefit of U.S. Patent App. No. 63/430,929, filed Dec. 7, 2022, the entire contents of both of which are incorporated herein by reference for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises one or more fins protruding from a substrate. A gate structure, configured to control the flow of charge carriers within a conductive channel of the FinFET device, wraps around the one or more fins. For example, in a tri-gate FinFET device, the gate structure wraps around three sides of each of the one or more fins, thereby forming conductive channels on three sides of each of the one or more fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
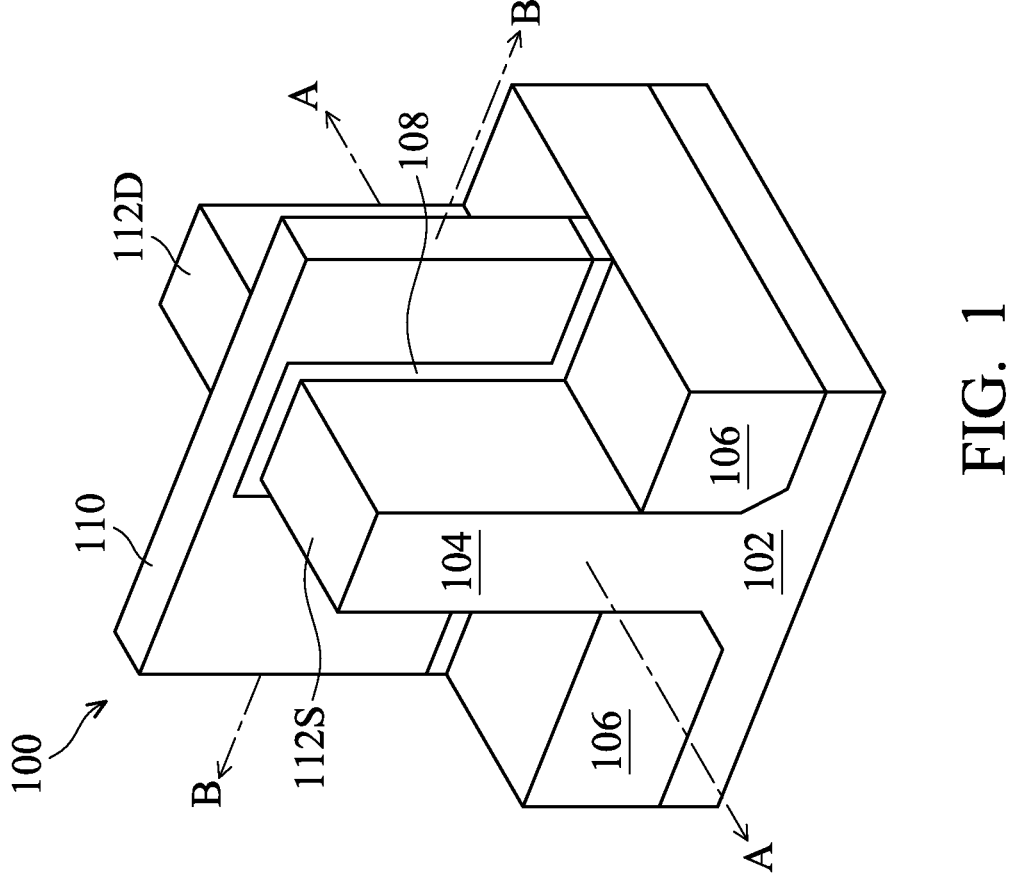
FIG. 1 illustrates a perspective view of a fin-based field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit typically includes a large number of devices (e.g., transistors). To fabricate these devices, a number of (e.g., planar and/or non-planar) active regions and a number of gate structures that intersect the active regions can be formed on a substrate or wafer to define such devices. To further configure those transistors to operate as certain circuits, some of the transistors can be operatively connected to or disconnected from each other. In general, to disconnect transistors in a relatively dense area of the substrate, an active (e.g., metal) gate structure overlaying multiple fin structures can be cut into multiple portions that overlay the respective fin structures of those disconnected devices. Such cut portions can be electrically isolated by a gate isolation structure. On the other hand, to disconnect transistors in a relatively sparse area of the substrate, an active (e.g., metal) gate structure overlaying multiple fin structures can be patterned, thereby removing a portion of the active gate structure that overlays one or more of the fin structures not configured as active channels (sometimes referred to as inactive channels) and removing the one or more inactive channels.

In the existing technologies, while removing a first portion of the metal gate structure (and the underlying inactive channel(s)) in the relatively sparse area, a second portion of the metal gate structure that overlays the fin structure(s) configured as active channels may be damaged, which damages a profile of the metal gate structure and in turn adversely impacts performance of the integrated circuit as a whole. For example, a certain portion of a gate isolation structure located between the first and second portions may also be removed, during the removal process of the first portion. While removing the portion of the gate isolation structure, an upper part of the gate isolation structure is typically (inadvertently) etched thinner. Such a thinned-down upper part can damage the profile of the metal gate structure that overlays the active channels, e.g., during the removal process of the first portion.

The present disclosure provides various embodiments of a semiconductor device that includes a number of transistors (e.g., FinFETs, gate-all-around (GAA) FETs), and a method for forming the same. In some embodiments, in a relatively sparse area of a substrate, a first gate isolation structure with a reverse-trapezoid profile (e.g., a wider upper portion and narrower lower portion) can be formed between two portions of a first active (e.g., metal) gate structure. In such embodiments, in a relatively dense area of the substrate, a second gate isolation structure formed between two portions of a second active (e.g., metal) gate structure can have nearly vertical sidewalls. In this way, while removing a first portion of the first metal gate structure that overlays an inactive channel, the wider upper portion of the first gate isolation structure can provide further buffer, thereby preventing etchants from penetrating to a second portion of first the metal gate structure that overlays an active channel. As such, the profiles and dimensions of an active gate structure can be accurately defined and reserved.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures may sometimes refer to these reference cross-sections for clarity.

Figure 2:
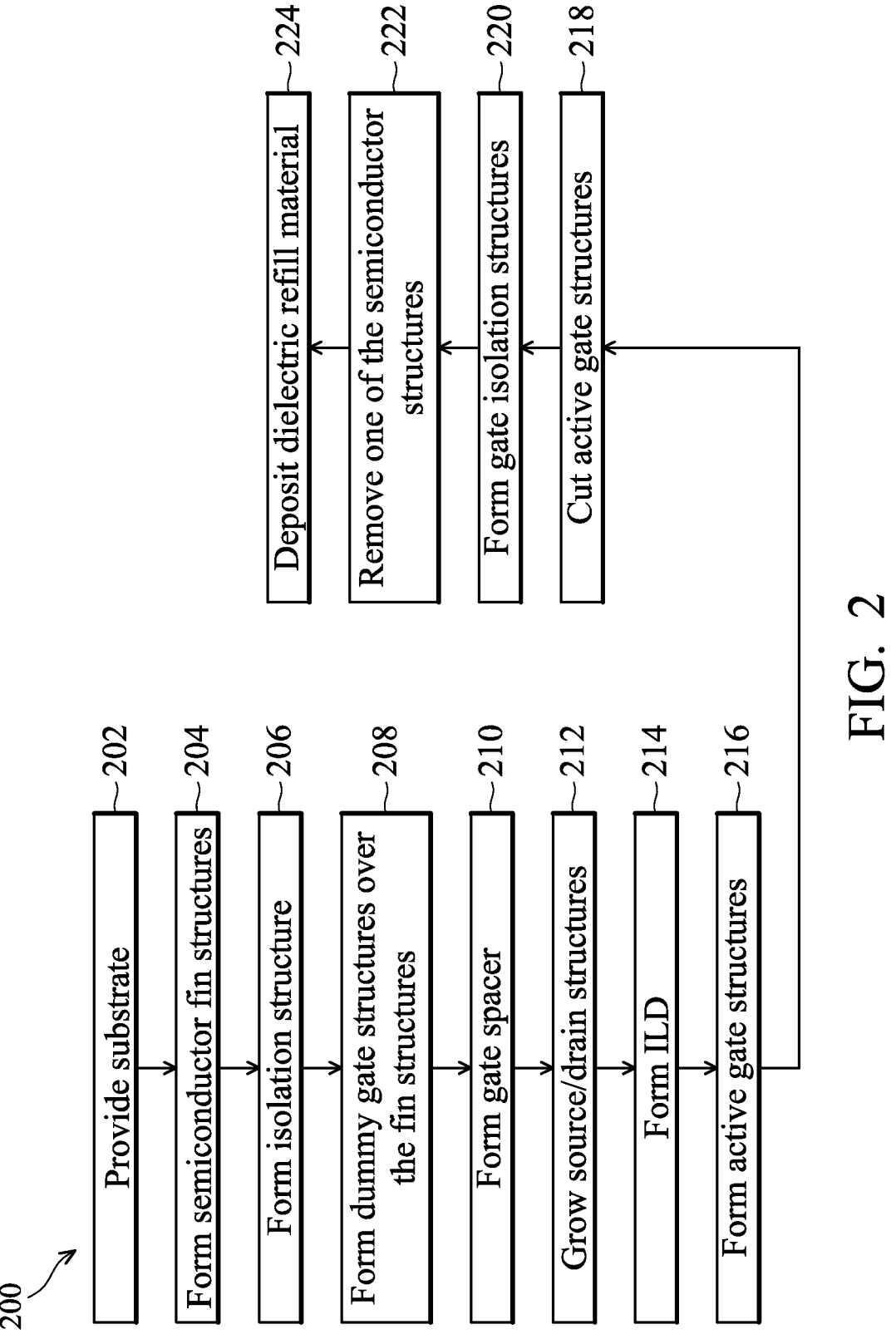
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanostructure transistor, like nanosheet transistor device, a nanowire transistor device, gate-all-around transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional or top views of an example semiconductor device at various fabrication stages as shown in FIGS. 3, 4, 5, 6, 7, 8, 9, 10, 11, 12, 13, 14, 15, 16, 17, 18, and 19, respectively, which will be discussed in further detail below.

In brief overview, the method 200 starts with operation 202 of providing a substrate. The method 200 continues to operation 204 of forming a number of semiconductor fin structures. The method 200 continues to operation 206 of forming an isolation structure. The method 200 continues to operation 208 of forming dummy gate structures over the fin structures. The method 200 continues to operation 210 of forming a gate spacer. The method 200 continues to operation 212 of growing source/drain structures. The method 200 continues to operation 214 of forming an interlayer dielectric (ILD). The method 200 continues to operation 216 of forming active gate structures. The method 200 continues to operation 218 of cutting the active gate structures. The method 200 proceeds to operation 220 of forming gate isolation structures. The method 200 proceeds to operation 222 of removing one of the semiconductor fin structures in one of the areas on the substrate. The method 200 continues to operation 224 of depositing a dielectric refill material.

As mentioned above, FIGS. 3-19 each illustrate, in a cross-sectional view, a portion of a semiconductor device 300 at various fabrication stages of the method 200 of FIG.

2. The semiconductor device 300 is similar to the FinFET device 100 shown in FIG. 1, but with multiple gate structures and multiple fins. For example, the semiconductor device 300 can include a plural number of gate structures each of which can overlay one or more fins. Although FIGS. 3-19 illustrate the semiconductor device 300, it is understood the semiconductor device 300 may include a number of other devices such as inductors, fuses, capacitors, coils, etc., which are not shown in FIGS. 3-19, for purposes of clarity of illustration.

Figure 3:
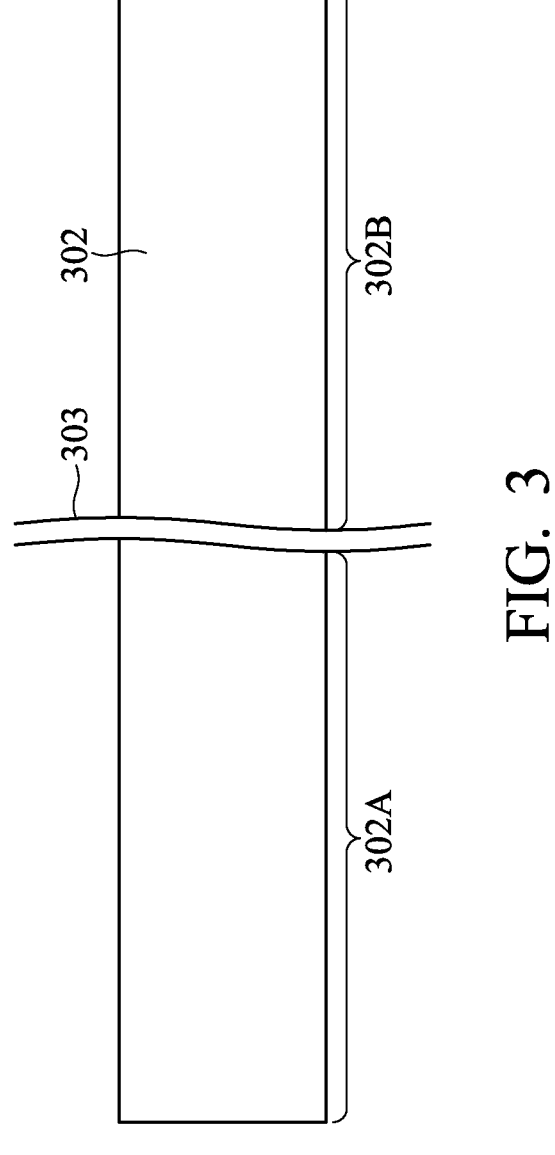
FIGS. 3, 4, 5, 6, 7, 8, 9, 10, 11, 12, 13, 14, 15, 16, 17, 18, and 19 illustrate cross-sectional or top views of an example semiconductor device during various fabrication stages, made by the method of FIG. 2, in accordance with some embodiments.

Corresponding to operation 202 of FIG. 2, FIG. 3 is a cross-sectional view of the semiconductor device 300 including a semiconductor substrate 302 at one of the various stages of fabrication, in some embodiments. The cross-sectional view of the semiconductor device 300 in FIG. 3 is cut along the lengthwise direction of a gate structure, e.g., cross-section B-B (as indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the semiconductor device 300 can include areas 302A and 302B. The area 302A can be configured to form a number of input/output (I/O) transistors (hereinafter "I/O area 302A"); and the area 302B can be configured to form a number of core transistors (hereinafter "core area 302B"). The terms "I/O transistor" and "core transistor," as used herein, may be generally referred to a transistor configured to operate under a relatively higher voltage (e.g., higher $V_{gs}$) and a transistor configured to operate under a relatively lower voltage (e.g., lower $V_{gs}$), respectively. Thus, it should be understood that the I/O transistor can include any of various other transistors operating under a relatively higher voltage and the core transistor can include any of various other transistors operating under a relatively lower voltage, while remaining within the scope of the present disclosure. The I/O transistor, when appropriately configured, may have a relatively thicker gate dielectric; and the core transistor, when appropriately configured, has a relatively thinner gate dielectric. Further, the I/O transistors may be formed in a first area of the substrate (e.g., I/O area 302A) with a relatively lower density of transistors; and the core transistors may be formed in a second area of the substrate (e.g., core area 302B) with a relatively higher density of transistors. As such, features (e.g., fins) in the I/O area 302A may be more sparsely formed, when compared to the features (e.g., fins) formed in the core area 302B.

As shown in FIG. 3 (and the following figures), the I/O area 302A and core area 302B are separated from each other by a symbolic divider 303, which can include additional features/components/devices that are omitted for simplicity. It should be appreciated that some of the operations of the method 200 may be concurrently performed in the I/O area 302A and core area 302B. For purposes of illustration, some of the feature(s) formed in the I/O area 302A and the core area 302B are hereinafter shown in the same figure that corresponds to one of the operations of the method 200.

Figure 4:
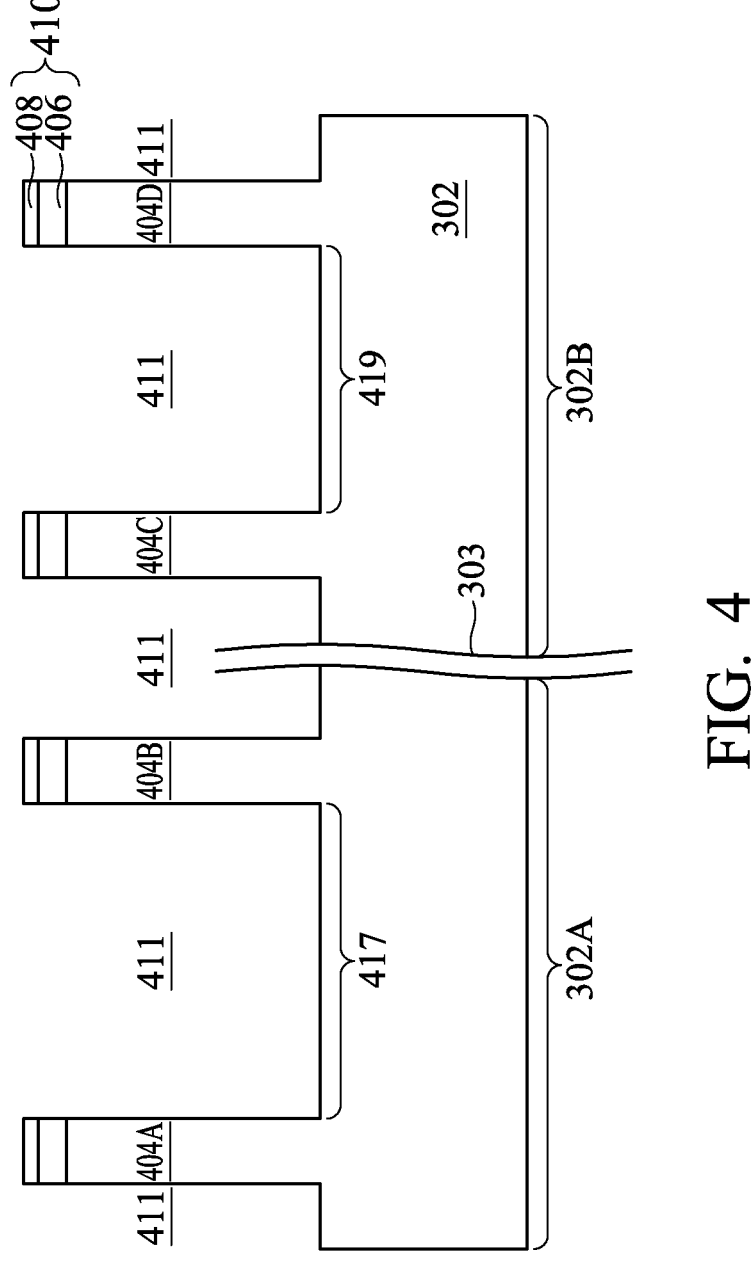

Corresponding to operation 204 of FIG. 2, FIG. 4 is a cross-sectional view of the semiconductor device 300 including semiconductor fin structures 404A, 404B, 404C, and 404D at one of the various stages of fabrication. The cross-sectional view of FIG. 4 is cut along the lengthwise direction of an active/dummy gate structure of the semiconductor device 300 (e.g., cross-section B-B indicated in FIG. 1).

The semiconductor fin structures 404A-B are formed in the I/O area 302A, and the semiconductor fin structures 404C-D are formed in the core area 302B. Although two semiconductor fin structures are shown in each of the I/O area 302A and core area 302B, it should be appreciated that the semiconductor device 300 can include any number of semiconductor fin structures in each of the areas 302A and 302B while remaining within the scope of the present disclosure.

Some of the semiconductor fin structures 404A-D, if still remains, may be each configured as an active fin, which will be adopted as an active (e.g., electrically functional) fin or channel in a completed FinFET. In the illustrated examples, the semiconductor fin structure 404A may be configured as the active channel of a first input/output (I/O) transistor of the semiconductor device 300 (sometimes referred to as "active I/O channel 404A"); the semiconductor fin structure 404B may be later removed from the semiconductor device 300 (sometimes referred to as "inactive I/O channel 404B"); the semiconductor fin structure 404C may be configured as the active channel of a first core transistor of the semiconductor device 300 (sometimes referred to as "active core channel 404C"); and the semiconductor fin structure 404D may be configured as the active channel of a second core transistor of the semiconductor device 300 (sometimes referred to as "active core channel 404D").

The semiconductor fin structures 404A-D are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the semiconductor fin structures 404A-D between adjacent trenches 411 as illustrated in FIG. 4. When multiple fin structures are formed, such a trench may be disposed between any adjacent ones of the fin structures. In some embodiments, the semiconductor fin structures 404A-D are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the semiconductor fin structures 404A-D.

The semiconductor fin structures 404A-D may be patterned by any suitable method. For example, the semiconductor fin structures 404A-D may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

As shown in FIG. 4, the semiconductor fin structures 404A-B in the I/O area 302A are formed to be separated from each other with a first spacing 417, and the semiconductor fin structures 404C-D in the core area 302B are formed to be separated from each other with a second spacing 419. In various embodiments, the first spacing 417 can be substantially greater than the second spacing 419. For example with a certain process node, the first spacing 417 can range from about 5 nanometers (nm) to about 500 nm, and the second spacing 419 can range from about 5 nm to about 500 nm.

FIGS. 3 and 4 illustrate an embodiment of forming the semiconductor fin structures 404A-D, but a fin structure may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fin structures 404A-D that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fin structures.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fin structures.

In embodiments where epitaxial material(s) or epitaxial structures (e.g., the heteroepitaxial structures or the homoepitaxial structures) are grown, the grown material(s)

or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fin structures 404A-D may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
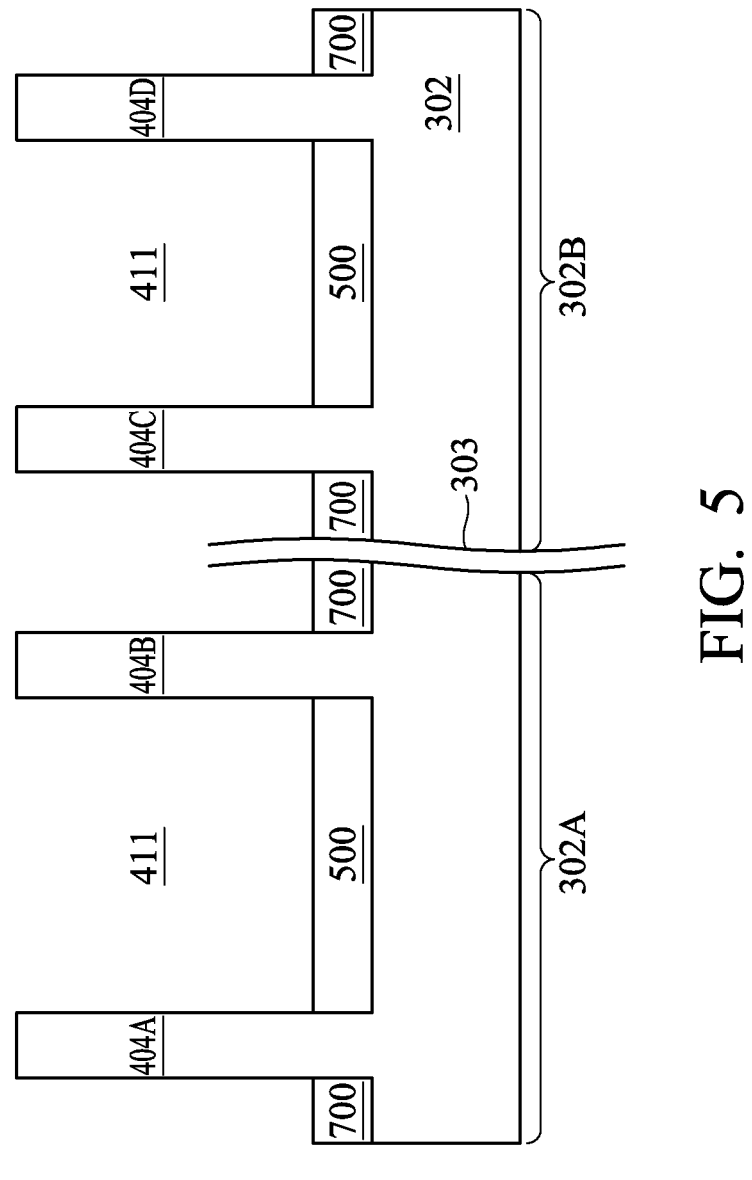

Corresponding to operation 206 of FIG. 2, FIG. 5 is a cross-sectional view of the semiconductor device 300 including isolation regions 500 at one of the various stages of fabrication. The cross-sectional view of FIG. 5 is cut along the lengthwise direction of an active/dummy gate structure of the semiconductor device 300 (e.g., cross-section B-B indicated in FIG. 1).

The isolation regions 500, which are formed of an insulation material, can electrically isolate neighboring fin structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fin structures 404A-D that are coplanar (not shown). The patterned mask 410 (FIG. 4) may also be removed by the planarization process.

In some embodiments, the isolation regions 500 include a liner, e.g., a liner oxide (not shown), at the interface between each of the isolation regions 500 and the substrate 302 (semiconductor fin structures 404A-D). In some embodiments, the liner oxide is formed to reduce crystalline defects at the interface between the substrate 302 and the isolation region 500. Similarly, the liner oxide may also be used to reduce crystalline defects at the interface between the fin structures 404A-D and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the semiconductor fin structures 404A-D protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

In some other embodiments, at least one dummy fin structure (formed of a dielectric material) may be formed between the adjacent semiconductor fin structures 404A and 404B and/or between the adjacent semiconductor fin structures 404C and 404D, i.e., in the trench 411. Such a dummy fin structure can be formed prior to, concurrently with, or subsequently to forming the STI regions 500. Further, the dummy fin structure can have a bottom surface aligned with or disposed below the top surface of the STI region 500 (i.e., the bottom surface of the dummy fin structure is in contact with the substrate 302), or have the bottom surface embedded in the STI region 500 (i.e., the bottom surface of the dummy fin structure is separated apart from the substrate 302 with the STI region 500).

Figure 6:
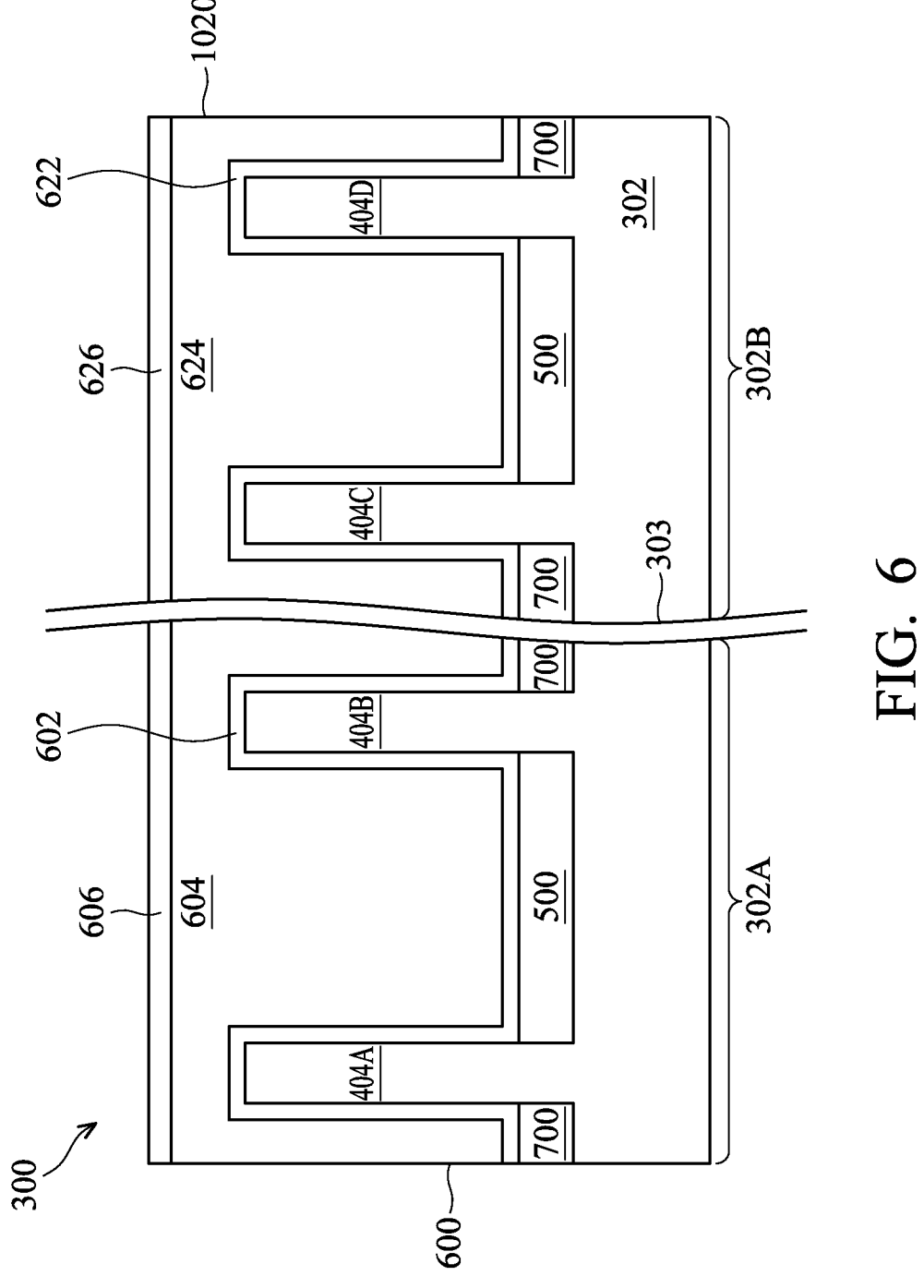

Corresponding to operation 208 of FIG. 2, FIG. 6 is a cross-sectional view of the semiconductor device 300 including a dummy gate structure 600 in the I/O area 302A and a dummy gate structure 620 in the core area 302B at one of the various stages of fabrication. The cross-sectional view of FIG. 6 is cut along a lengthwise direction of the dummy gate structures 600 and 620 of the semiconductor device 300 (e.g., cross-section B-B indicated in FIG. 1).

The dummy gate structure 600 is formed to overlay a respective portion of each of the fin structures (e.g., semiconductor fin structures 400A-B) in the I/O area 302A. Prior to, concurrently with, or subsequently to forming the dummy gate structure 600 in the I/O area 302A, a dummy gate structure 620 may be formed in the core area 302B to overlay a portion of each of the semiconductor fin structures 404C-D. The dummy gate structure 620 is similar to the dummy gate structure 600, except for its dimensions, and thus, the dummy gate structure 620 will be briefly discussed below.

The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the semiconductor fin structures 404A-B. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. Similarly, the dummy gate structure 620 includes a dummy gate dielectric 622 and a dummy gate 624, with a mask 626 formed thereon.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 606 (626). The pattern of the mask 606 (626) then may be transferred to the gate layer and the dielectric layer by a suitable etching technique to form the dummy gate 604 (624) and the underlying dummy gate dielectric 602 (622), respectively. The dummy gate 604 and the dummy gate dielectric 602 cover a respective portion (e.g., a channel region) of each of the semiconductor fin structures 404A-B; and the dummy gate 1024 and the dummy gate dielectric 622 cover a portion (e.g., a channel region) of the semiconductor fin structures 404C-D. The dummy gate 604 (624) may also have a lengthwise direction (e.g., direction B-B of FIG. 1) perpendicular to the length-wise direction (e.g., direction of A-A of FIG. 1) of the fin structures.

The dummy gate dielectric 602 is shown to be formed over the semiconductor fin structures 404A-B (e.g., over the respective top surfaces and the sidewalls of the fin structures) and over the STI regions 500 in the example of FIG. 6. Similarly, the dummy gate dielectric 622 is formed to overlay the semiconductor fin structures 404C-D (e.g., over-laying the respective top surfaces and the sidewalls of the fin structures). In other embodiments, the dummy gate dielectric 602 (622) may be formed by, e.g., thermal oxidization of a material of the semiconductor fin structures, and therefore, may be formed over the semiconductor fin structures but not over the STI regions 500. It should be appreciated that these and other variations are still included within the scope of the present disclosure.

Figure 7:
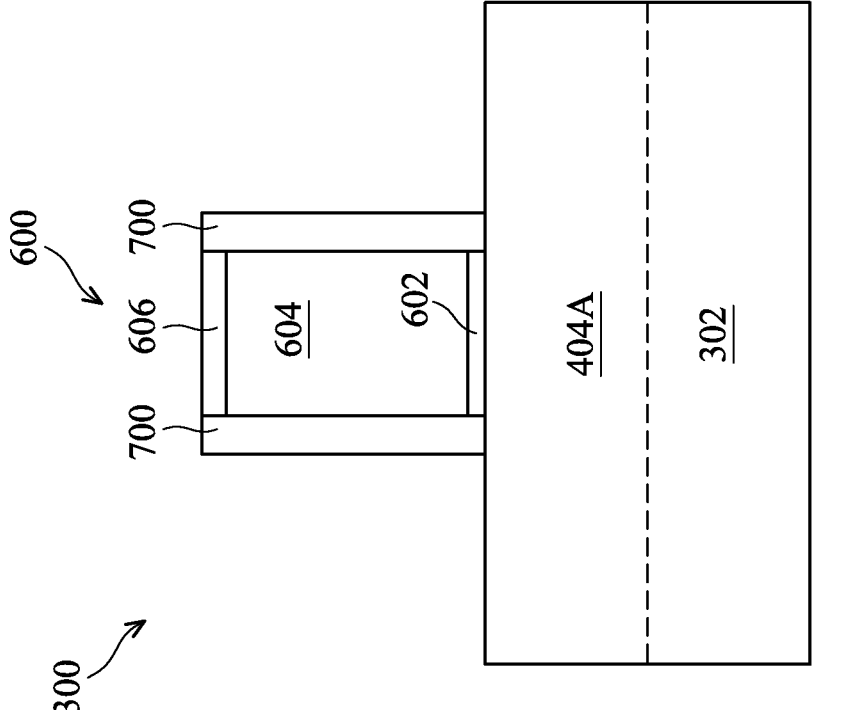
Figure 8:
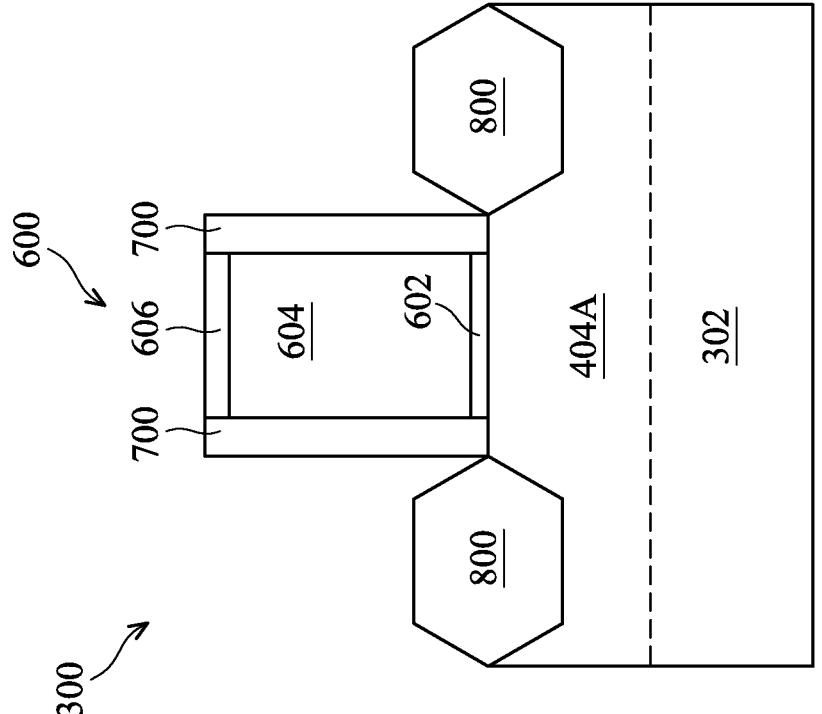
Figure 9:
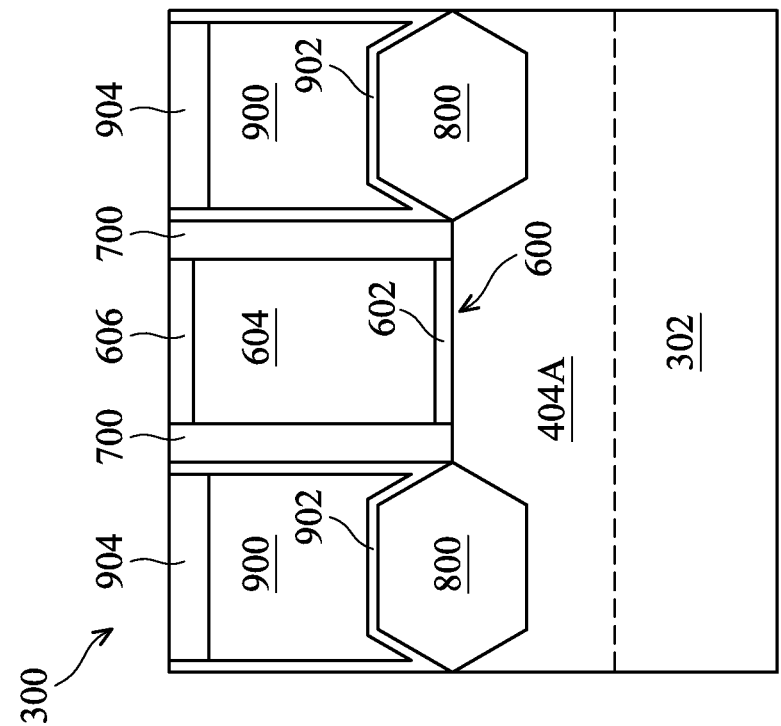

FIGS. 7-9 illustrate the cross-sectional views of further processing (or making) of the semiconductor device 300 along cross-section A-A of one of the semiconductor fin structures 404A-D (as indicated in FIG. 1). One dummy gate structure 600 is illustrated over the semiconductor fin structure 404A, which is selected as a representative example, in FIGS. 7-9. It should be appreciated that more than one dummy gate structure can be formed over the semiconductor fin structure 404A (and each of the other semiconductor fin structures, e.g., 404B-D), while remaining within the scope of the present disclosure.

Corresponding to operation 210 of FIG. 2, FIG. 7 is a cross-sectional view of the semiconductor device 300 including gate spacer 700 formed around (e.g., along and contacting the sidewalls of) the dummy gate structure 600. For example, the gate spacer 700 may be formed on oppos-ing sidewalls of the dummy gate structure 600. It should be understood that any number of gate spacers can be formed around the dummy gate structures 600 while remaining within the scope of the present disclosure.

The gate spacer 700 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 700. The shapes and formation methods of the gate spacer 700 as illustrated in FIG. 7 are merely non-limiting examples, and other shapes and formation methods are possible. These and other variations are fully intended to be included within the scope of the present disclosure.

Corresponding to operation 212 of FIG. 2, FIG. 8 is a cross-sectional view of the semiconductor device 300 including a number of source/drain regions 800 at one of the various stages of fabrication. The source/drain regions 800 are formed in recesses of the semiconductor fin structure 404A adjacent to the dummy gate structures 600, e.g., between adjacent dummy gate structures 600 and/or next to a dummy gate structure 600. The recesses are formed by, e.g., an anisotropic etching process using the dummy gate structures 600 as an etching mask, in some embodiments, although any other suitable etching process may also be used.

The source/drain regions 800 are formed by epitaxially growing a semiconductor material in the recess, using suit-able methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain struc-tures 800 may have surfaces raised from respective surfaces of the semiconductor fin structure 404A (e.g. raised above the non-recessed portions of the semiconductor fin structure 404A) and may have facets. In some embodiments, the source/drain structures 800 of the adjacent semiconductor fin structures may merge to form a continuous epitaxial source/drain structure (not shown). In some embodiments, the source/drain structures 800 of the adjacent semiconduc-tor fin structures may not merge together and remain sepa-rate source/drain structures 800 (not shown). In some embodiments, when the resulting FinFET device is an n-type FinFET, the source/drain structures 800 can include silicon carbide (SiC), silicon phosphorous (SiP), phosphorous-doped silicon carbon (SiCP), or the like. In some embodi-ments, when the resulting FinFET device is a p-type FinFET, the source/drain structures 800 comprise SiGe, and a p-type impurity such as boron or indium.

The epitaxial source/drain structures 800 may be implanted with dopants to form source/drain structures 800 followed by an annealing process. The implanting process may include forming and patterning masks such as a pho-toresist to cover the regions of the semiconductor device 300 that are to be protected from the implanting process. The source/drain structures 800 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain structures 800 of a P-type transistor. N-type impurities, such as phospho-rous or arsenide, may be implanted in the source/drain structures 1200 of an N-type transistor. In some embodi-ments, the epitaxial source/drain structures 800 may be in situ doped during their growth.

Corresponding to operation 214 of FIG. 2, FIG. 9 is a cross-sectional view of the semiconductor device 300 including an interlayer dielectric (ILD) 900 at one of the various stages of fabrication. In some embodiments, prior to forming the ILD 900, a contact etch stop layer (CESL) 902 is formed over the structure, as illustrated in FIG. 9. The CESL 902 can function as an etch stop layer in a subsequent etching process, and may comprise a suitable material such as silicon oxide, silicon nitride, silicon oxynitride, combi-nations thereof, or the like, and may be formed by a suitable formation method such as CVD, PVD, combinations thereof, or the like.

Next, the ILD 900 is formed over the CESL 902 and over the dummy gate structures 1000. In some embodiments, the ILD 900 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 900 is formed, an optional dielectric layer 1304 is formed over the ILD 900. The dielectric layer 904 can function as a protection layer to prevent or reduces the loss of the ILD 900 in subsequent etching processes. The dielectric layer 904 may be formed of a suitable material, such as silicon nitride, silicon carbonitride, or the like, using a suitable method such as CVD, PECVD, or FCVD. After the dielectric layer 904 is formed, a planarization process, such as a CMP process, may be performed to achieve a level upper surface for the dielectric layer 904. The CMP may also remove the mask 606 and portions of the CESL 902 dis-posed over the dummy gate 604 (FIG. 8). After the planar-ization process, the upper surface of the dielectric layer 904 is level with the upper surface of the dummy gate 604, in some embodiments.

Figure 10:
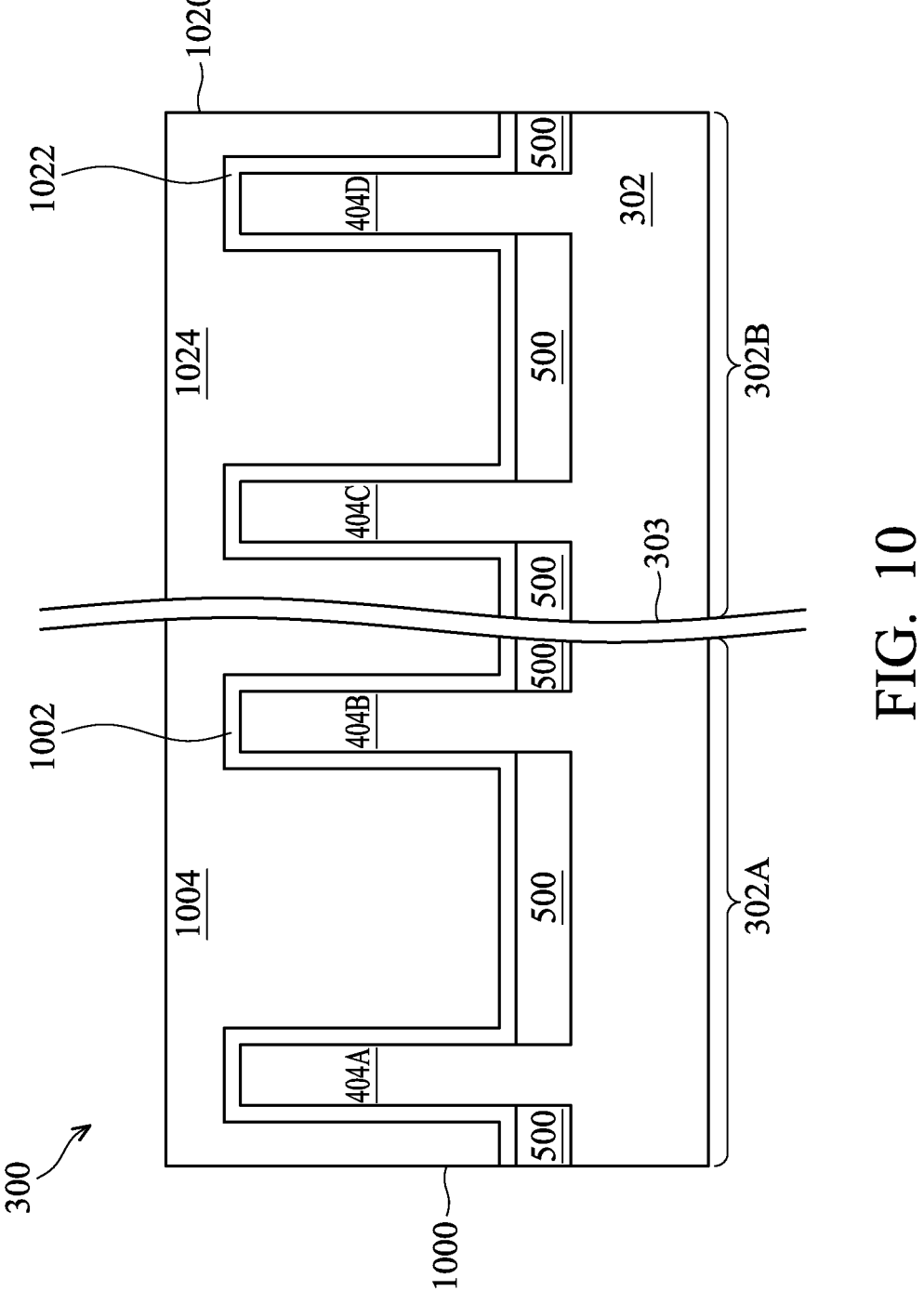
Figure 11:
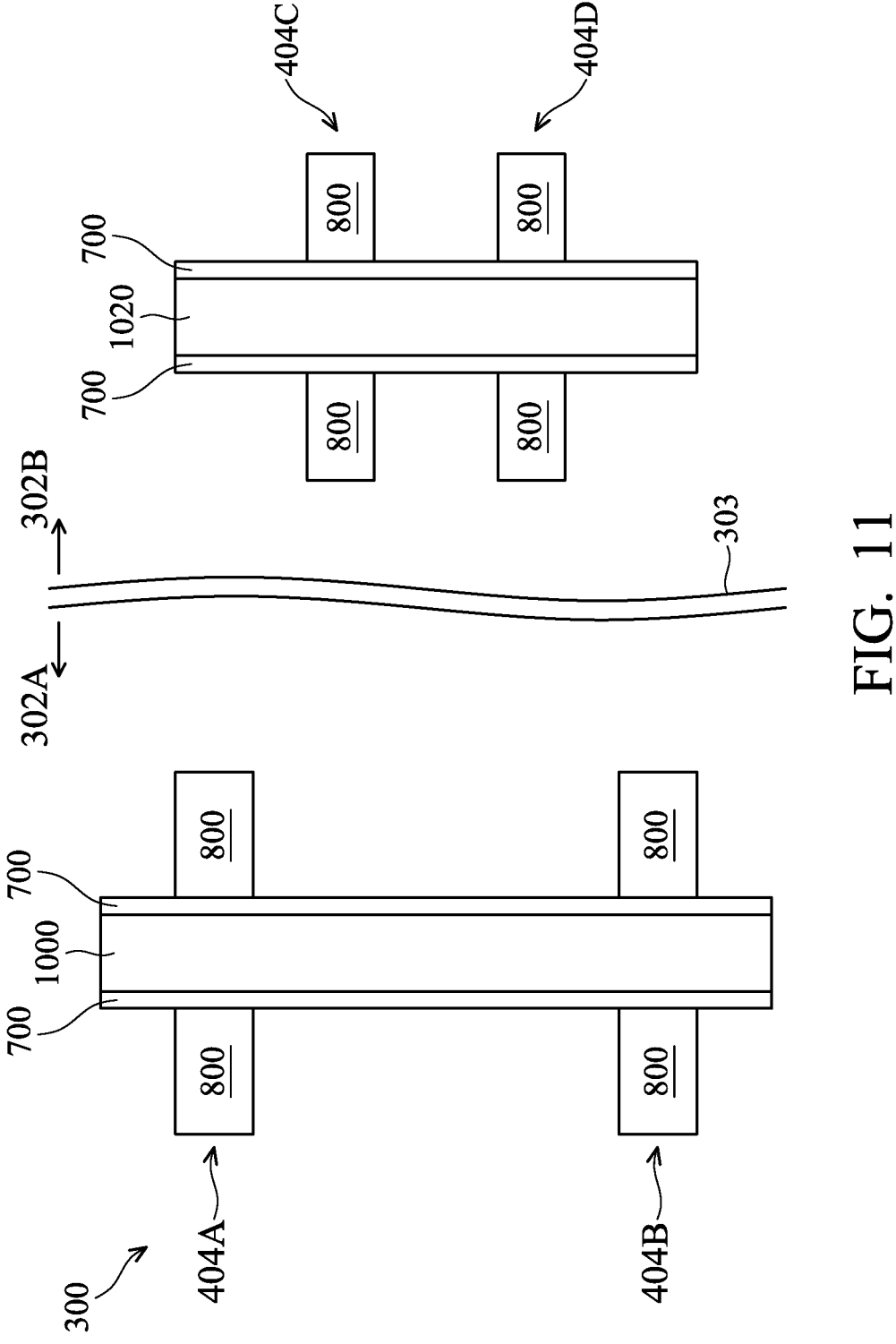

Corresponding to operation 216 of FIG. 2, FIG. 10 is a cross-sectional view of the semiconductor device 300 in which active gate structures 1000 and 1020 replace the dummy gate structures 600 (in the I/O area 302A) and 620 (in the core area 302B), respectively, at one of the various stages of fabrication. The cross-sectional view of FIG. 10 is cut along the lengthwise direction of the active gate structures 1000 and 1020 of the semiconductor device 300 (e.g., cross-section B-B indicated in FIG. 1). For illustration, an example top view of the semiconductor device 300 (without the ILD 900 being displayed) is shown in FIG. 11.

The active gate structure 1000 may be formed by replacing the dummy gate structure 600 (FIG. 6); and the active gate structure 1020 may be formed by replacing the dummy gate structure 620 (FIG. 6). As illustrated in FIGS. 10-11, the active gate structure 1000 can straddle or otherwise overlay respective (e.g., central) portions of the semiconductor fin structures 404A and 404B; and the active gate structure 1020 can straddle or otherwise overlay respective (e.g., central) portions of the semiconductor fin structures 404C and 404D.

The active gate structures 1000 and 1020 can each include a gate dielectric layer (e.g., 1002, 1022), a metal gate layer (1004, 1024), and one or more other layers that are not shown for clarity. For example, each of the active gate structures 1000 and 1020 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers 1002 and 1022 each include silicon oxide, silicon nitride, or multilayers thereof. In example embodiments, the gate dielectric layers 1002 and 1022 each include a high-k dielectric material, and in these embodiments, the gate dielectric layers 1002 and 1022 may each have a k value greater than about 7.0, and may include a metal oxide or a silicate of Hf, Al, Zr, La, Mg, Ba, Ti, Pb, or combinations thereof. The formation methods of the gate dielectric layers 1002 and 1022 may include molecular beam deposition (MBD), atomic layer deposition (ALD), PECVD, and the like. A thickness of each of the gate dielectric layers 1002 and 1022 may be between about 8 angstroms (Å) and about 20 Å, as an example.

The metal gate layers 1004 and 1024 may each be a P-type work function layer, an N-type work function layer, multi-layers thereof, or combinations thereof, in some embodiments. Accordingly, the metal gate layers 1004 and 1024 may each be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, ZrSi$_2$, MoSi$_2$, TaSi$_2$, NiSi$_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage V$_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

Figure 12:
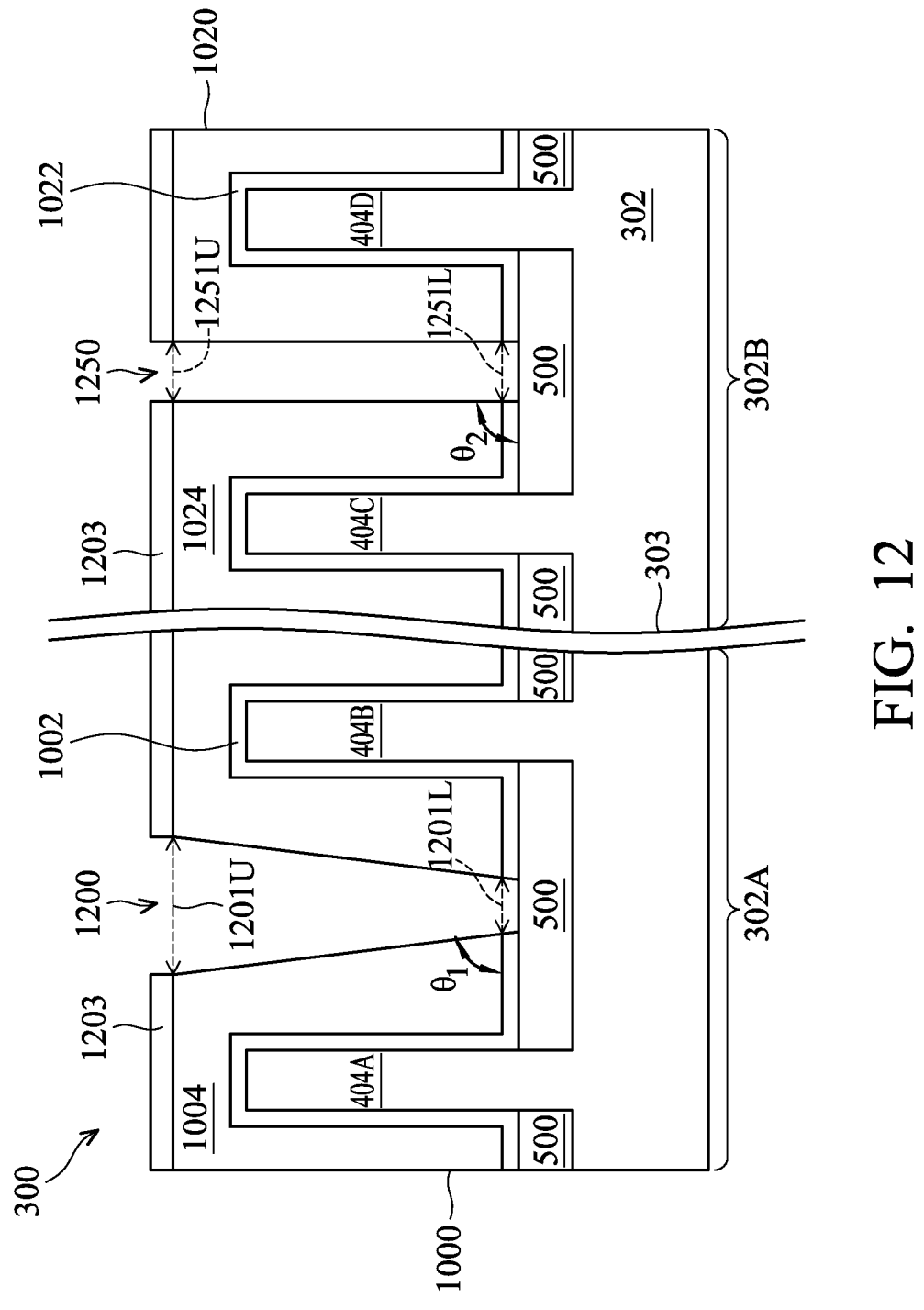
Figure 13:
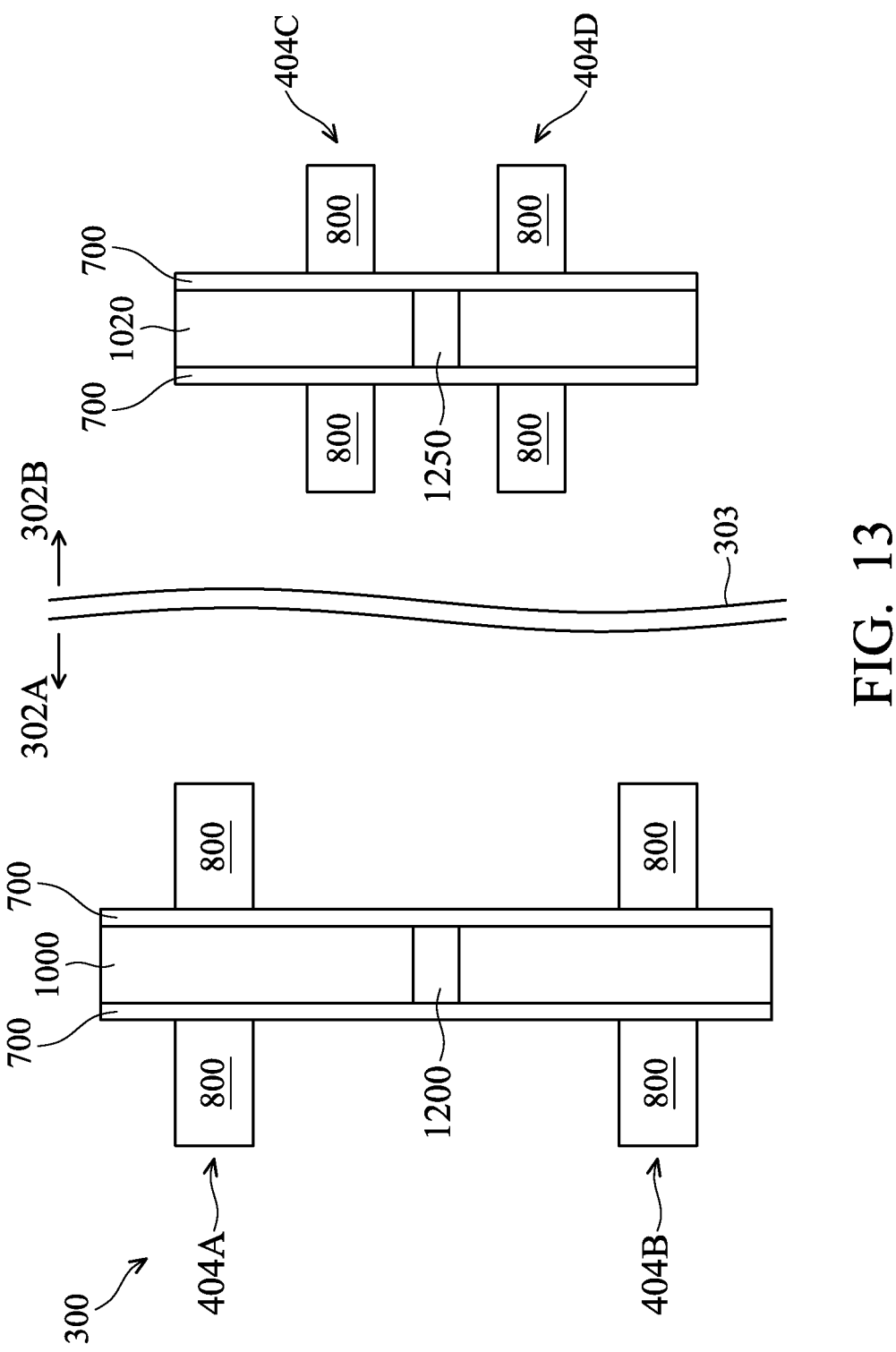

Corresponding to operation 218 of FIG. 2, FIG. 12 is a cross-sectional view of the semiconductor device 300 in which the active gate structures 1000 and 1020 are respectively cut, intercepted, or otherwise disconnected to form a gate cut trench 1200 in the I/O area 302A and a gate cut trench 1250 in the core area 302B at one of the various stages of fabrication. The cross-sectional view of FIG. 12 is cut along the lengthwise direction of the active gate structures 1000 and 1020 of the semiconductor device 300 (e.g., cross-section B-B indicated in FIG. 1). For illustration, an example top view of the semiconductor device 300 (without the ILD 900 being displayed) is shown in FIG. 13.

To form the gate cut trench 1200, one or more etching processes may be performed to remove a portion of the metal gate 1004 and a portion of the gate dielectric 1002 that are interposed between the semiconductor fins 404A and 404B. Concurrently with forming the gate cut trench 1200, the same etching process(es) may be performed to remove a portion of the metal gate 1024 and a portion of the gate dielectric 1022 that are interposed between the semiconductor fins 404C and 404D. The etching process(es) may stop when the top surfaces of the STI regions 500 in the I/O area 302A and core area 302B are respectively exposed.

Further, prior to the etching process(es), a mask 1203 may be formed over the active gate structures 1000 and 1020 to expose portions of the metal gates 1004 and 1024 desired to be removed by forming openings in the I/O area 302A and the core area 302B, respectively. Through the mask 1203, the etching process(es) are performed to remove the respective portions of the active gate structures 1000 and 1020. By using a certain characteristic of the etching process(es) (which will be discussed as follows), the gate cut trench 1200 can be formed to have a reverse-trapezoid profile, e.g., with a width of its upper portion (1201U) wider than a width of its lower portion width (1201L); and the gate cut trench 1250 can be formed to have a rectangular profile, e.g., with a width of its upper portion (1251U) about the same as a width of the lower portion width (1251L).

In various embodiments, the etching process(es) may have one or more stages, each of which can be characterized with a respective combination of anisotropic etching and isotropic etching. For example, a first stage may have more anisotropic etching than isotropic etching. In other words, the first stage can vertically (or along a certain direction) etch the active gate structures 1000 and 1020 more quickly than it laterally etches the active gate structures 1000 and 1020. As such, after the first stage, the gate cut trenches 1200 and 1250 may each present a valley-shaped profile.

The first stage can include a plasma etching process. In such a plasma etching process (including radical plasma etching, remote plasma etching, and other suitable plasma etching processes), gaseous etchants such as chlorine (Cl$_2$), hydrogen bromide (HBr), carbon tetrafluoride (CF$_4$), fluoroform (CHF$_3$), difluoromethane (CH$_2$F$_2$), fluoromethane (CH$_3$F), hexafluoro-1,3-butadiene (C$_4$F$_6$), boron trichloride (BCl$_3$), sulfur hexafluoride (SF$_6$), hydrogen (H$_2$), nitrogen trifluoride (NF$_3$), and other suitable gaseous etchants and combinations thereof can be used with passivation gases. The passivation gases can include nitrogen (N$_2$), oxygen (O$_2$), carbon dioxide (CO$_2$), sulfur dioxide (SO$_2$), carbon monoxide (CO), methane (CH$_4$), silicon tetrachloride (SiCl$_4$), and other suitable passivation gases and combinations thereof. Moreover, for the plasma etching process, the etchants and/or the passivation gases can be diluted with gases such as argon (Ar), helium (He), neon (Ne), and other suitable dilutive gases and combinations thereof.

As a non-limiting example, in the first stage, a source power $P_1$ (e.g., ranging from about 500 watts to about 800 watts) and a bias power $P_2$ (e.g., ranging from about 200 watts to 300 watts) may be applied during the first 60% of the first stage, under a pressure of 1 millitorr to 5 torr and an etch gas flow of 0 standard cubic centimeters per minute to 5000 standard cubic centimeters per minute. For the rest 40% of the first stage, while the source power $P_1$ may keep constant, the bias power may be reduced to about 0 watts. As such, during the first 60%, the first stage may present a higher amount/extent of the anisotropic etching, and during the rest 40%, the amount of anisotropic etching may be reduced to be comparable with an amount of the isotropic etching. However, it is noted that source powers (and their applied time durations), bias powers (and their applied time durations), pressures, and flow rates outside of these ranges can also be contemplated, while remaining within the scope of the present disclosure.

Following the first stage, a second stage performed may have a mixture of anisotropic etching and isotropic etching. In other words, the second stage can vertically (or along a certain direction) etch the active gate structures 1000 and 1020 while laterally etching the active gate structures 1000 and 1020. The valley-shaped profiles of the gate cut trenches 1200 and 1250 can thus laterally extend until the gate cut trenches 1200 and 1250 expose the top surfaces of the STI regions 500, respectively. As such, the gate cut trench 1200 can present a reverse-trapezoid profile and the gate cut trench 1250 can present a rectangular profile, as illustrated in FIG. 12.

For example, the gate cut trench 1200 has its upper portion with a width, 1201U, that is greater than the width 1201L of its lower portion, and the gate cut trench 1250 has its upper portion with a width, 1251U, that is about the same as the width 1251L of its lower portion. Alternatively stated, the gate cut trench 1200 may have at least one of its sidewalls and the top surface of the STI region 500 (or the top surface of the substrate 302) to form an acute angle, $\theta_1$, and the gate cut trench 1250 may have at least one of its sidewalls and the top surface of the STI region 500 (or the top surface of the substrate 302) to form a nearly right angle, $\theta_2$. In a non-limiting example, the angle $\theta_1$ may range between about 60 degrees and about 80 degrees, and the angle $\theta_2$ may be about 90 degrees.

The second stage can include a plasma etching process. In such a plasma etching process (including radical plasma etching, remote plasma etching, and other suitable plasma etching processes), gaseous etchants such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gaseous etchants and combinations thereof can be used with passivation gases. The passivation gases can include nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the etchants and/or the passivation gases can be diluted with gases such as argon (Ar), helium (He), neon (Ne), and other suitable dilutive gases and combinations thereof.

As a non-limiting example, in the second stage, a source power $P_1$ (e.g., ranging from about 800 watts to about 1200 watts) and a bias power $P_2$ (e.g., ranging from about 200 watts to 300 watts) may be applied during the first 10% of the second stage, under a pressure of 1 millitorr to 5 torr and an etch gas flow of 0 standard cubic centimeters per minute to 5000 standard cubic centimeters per minute. For the next 40% of the second stage, the source power may be reduced to $P_3$ (e.g., ranging from about 120 watts to 160 watts), and the bias power may be reduced to about 0 watts. During the rest 50% of the second stage, the source power is reduced to about 0 watts, and the bias power is increased to $P_4$, which ranges from about 80 watts to about 100 watts. As such, after the first 10% (the next 40%), the second stage may present a higher amount/extent of the isotropic etching than an amount of the anisotropic etching, which may result from a relatively high amount of radicals. During the rest 50%, the second stage may present a higher amount of the anisotropic etching than an amount of the isotropic etching. For example, in the rest 50%, the radicals can be pulled along a certain direction (e.g., a vertical direction) to further shape the valley-shaped profiles to present the profiles, as shown in FIG. 12. However, it is noted that source powers (and their applied time durations), bias powers, pressures (and their applied time durations), and flow rates outside of these ranges can also be contemplated, while remaining within the scope of the present disclosure.

Figure 14:
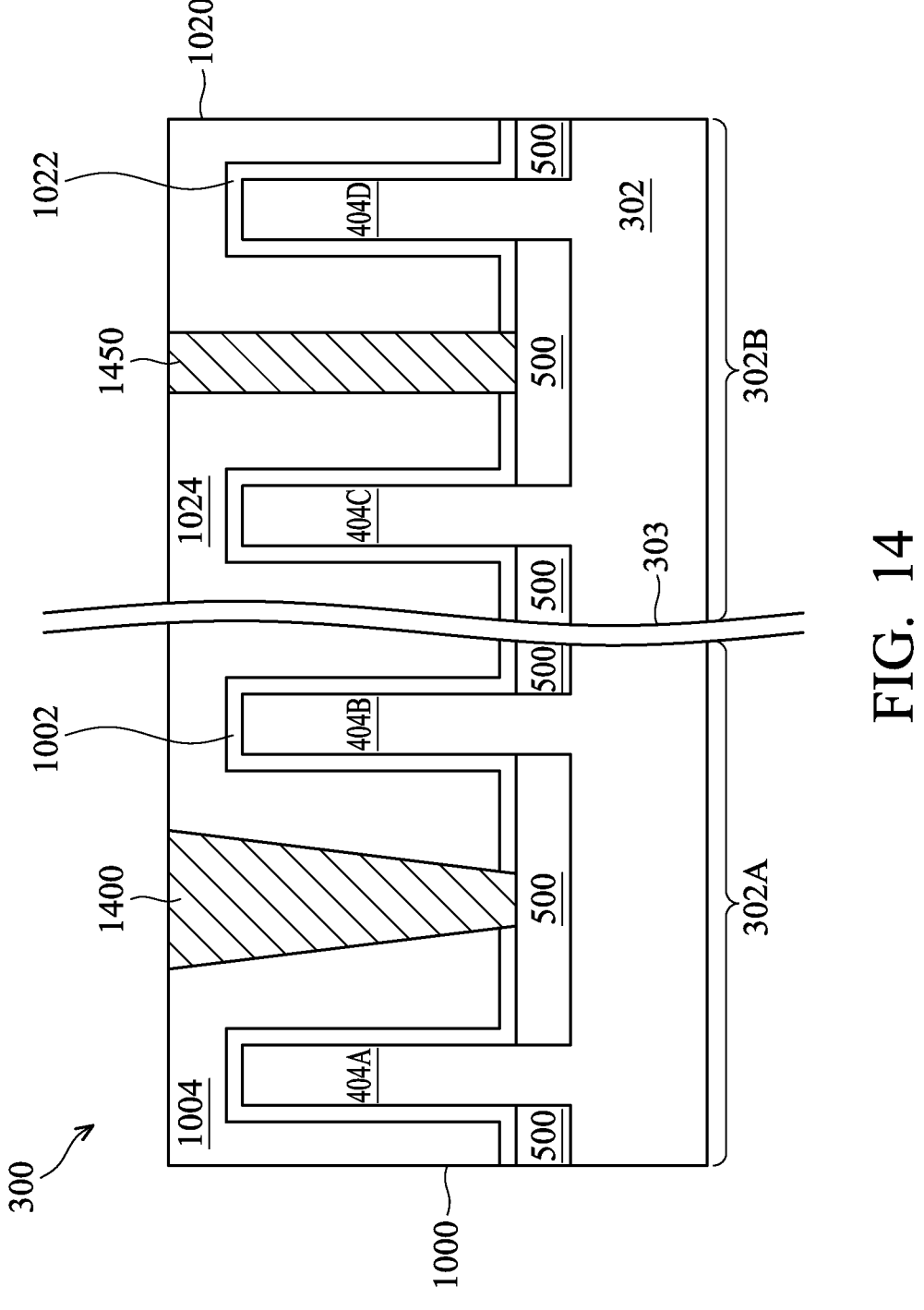
Figure 15:
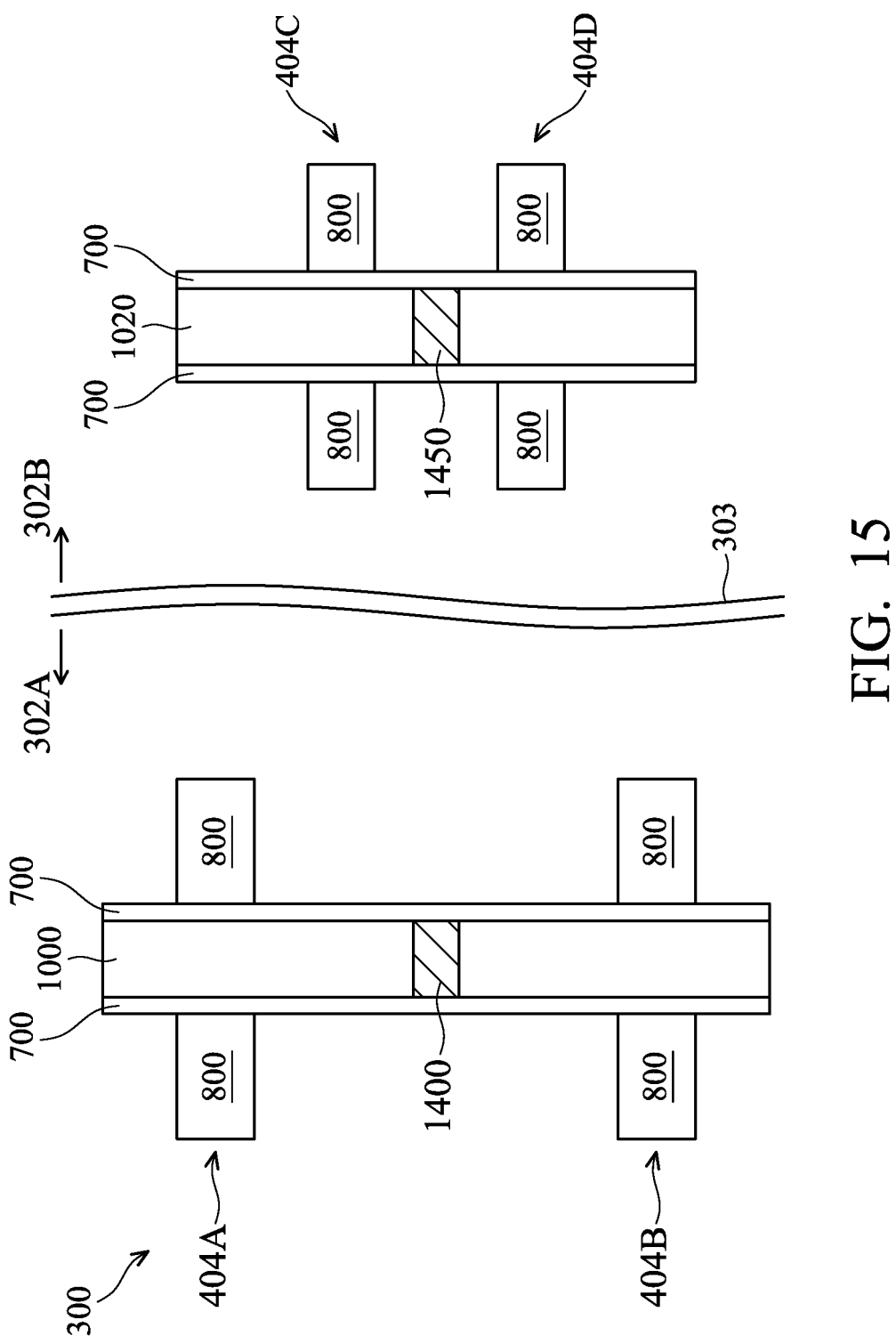

Corresponding to operation 220 of FIG. 2, FIG. 14 is a cross-sectional view of the FinFET device 300 including a gate isolation structure 1400 in the I/O area 302A and a gate isolation structure 1450 in the core area 302B at one of the various stages of fabrication. The cross-sectional view of FIG. 14 is cut along the lengthwise direction of the active gate structures 1000 and 1020 of the FinFET device 300 (e.g., cross-section B-B indicated in FIG. 1). For illustration, an example top view of the semiconductor device 300 (without the ILD 900 being displayed) is shown in FIG. 15.

The gate isolation structures 1400 and 1450 are formed by filling the gate cut trenches 1200 and 1250, respectively, with a dielectric material. As such, the gate isolation structures 1400 and 1450 can inherit the profiles (or dimensions) of the gate cut trenches 1200 and 1250, respectively. For example, the gate isolation structure 1400 can have its sidewalls separated from each other by a distance (or a critical dimension) gradually decreasing with an increasing depth toward the substrate 302. Alternatively stated, one sidewall of the gate isolation structure 1400 (e.g., the sidewall of the left-hand side in FIG. 14) can tilt toward the semiconductor fin structure 404A, and the other sidewall of the gate isolation structure 1400 (e.g., the sidewall of the right-hand side in FIG. 14) can tilt toward the semiconductor fin structure 404B. The gate isolation structure 1450 can have its sidewalls separated from each other by a distance (or a critical dimension), with a variation less than ±10%. Alternatively stated, both sidewalls of the gate isolation structure 1450 may be nearly perpendicular to the top surface of the substrate 302.

The dielectric material that is used to form the gate isolation structures 1400 and 1450 may include, for example, silicon oxide, silicon nitride, silicon oxynitride, silicon carbide, silicon carbonitride, silicon oxycarbonitride, silicon oxycarbide, or combinations thereof. The gate isolation structures 1400 and 1450 can be formed by depositing the dielectric material in the gate cut trenches 1200 and 1250, respectively, using any suitable method, such as CVD, PECVD, or FCVD. After the deposition, a CMP may be performed to remove any excess dielectric material from the remaining active gate structures 1000 and 1020.

Although the example of FIG. 14 shows that the gate isolation structures 1400 and 1450 respectively fill the gate cut trenches 1200 and 1250 with a single dielectric piece (which can include one or more dielectric materials listed above), it is understood that the gate isolation structures 1400 and 1450 can each include multiple pieces. Each of the pieces may include, for example, silicon oxide, silicon nitride, silicon oxynitride, silicon carbide, silicon carbonitride, silicon oxycarbonitride, silicon oxycarbide, or combinations thereof. For example, the gate isolation structures 1400 and 1450 may each include a first piece, which is formed as a conformal layer lining the respective gate cut trench, and a second piece, which fills the gate cut trench with the first piece coupled therebetween. In another example, the gate isolation structures 1400 and 1450 may each include a first piece, which fills a lower portion of the respective gate cut trench, and a second piece, which fills an upper portion of the gate cut trench.

Figure 16:
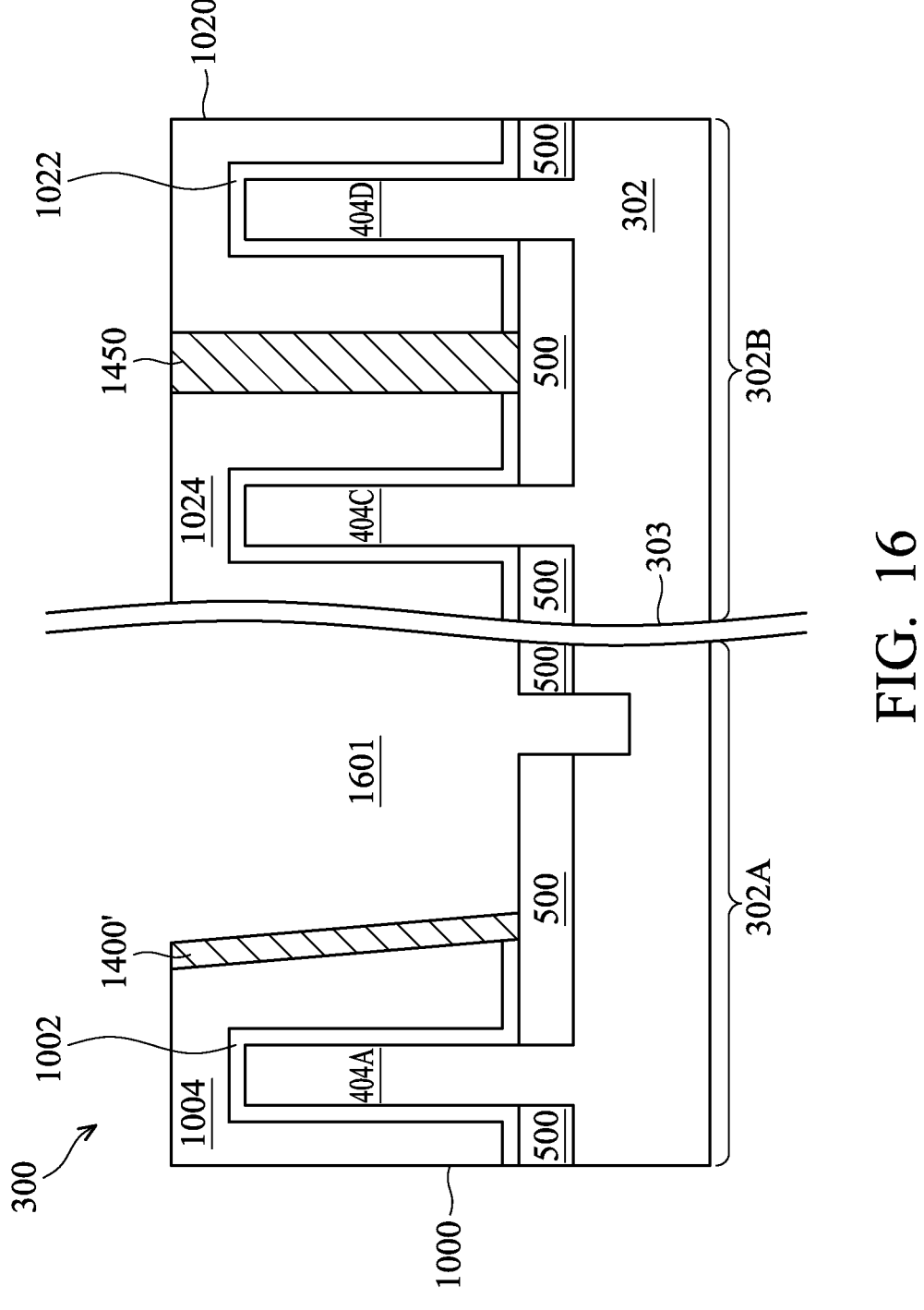
Figure 17:
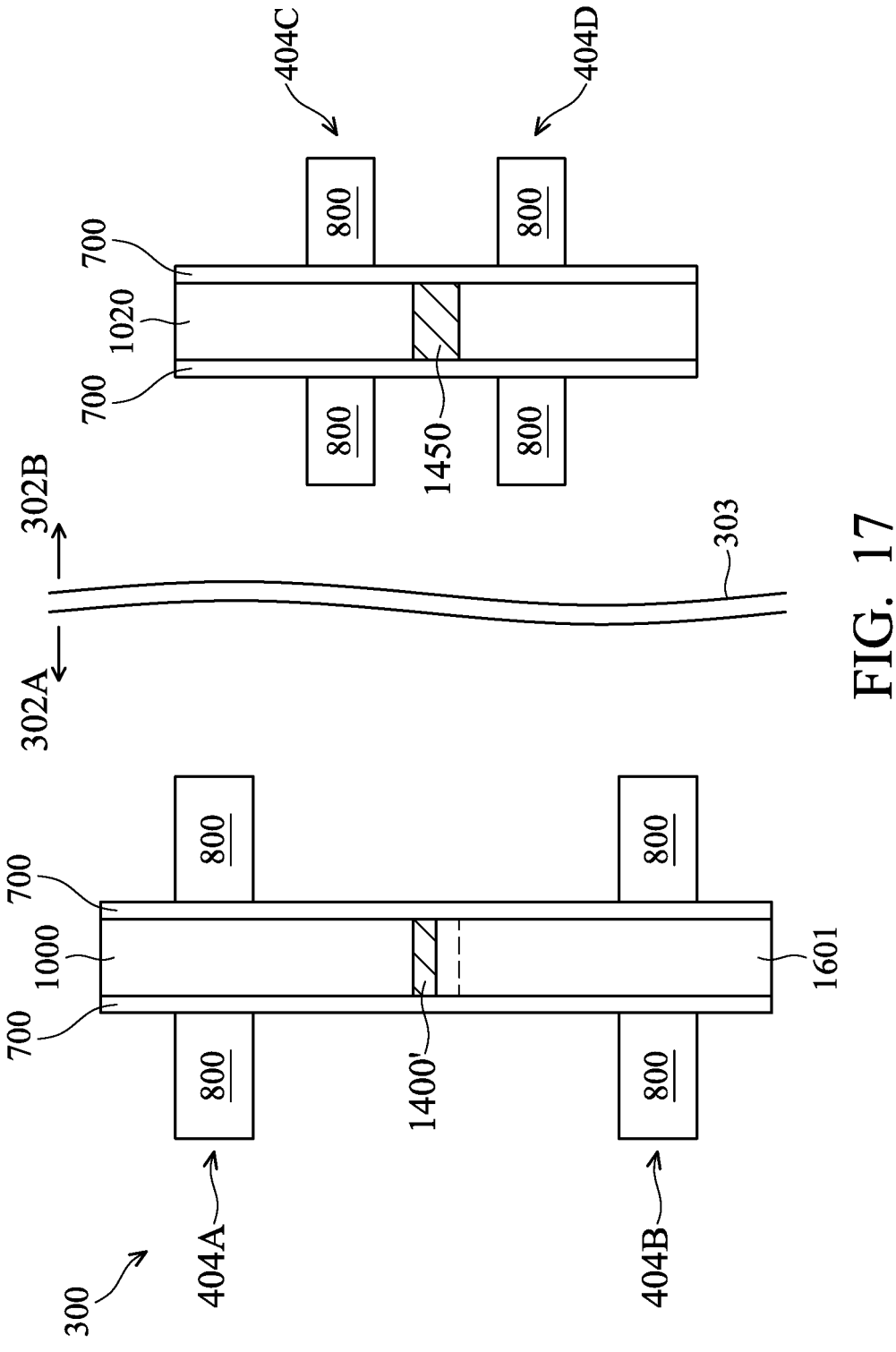

Corresponding to operation 222 of FIG. 2, FIG. 16 is a cross-sectional view of the FinFET device 300 in which a cavity 1601 is formed at one of the various stages of fabrication. The cross-sectional view of FIG. 16 is cut along the lengthwise direction of the active gate structures 1000 and 1020 of the FinFET device 300 (e.g., cross-section B-B indicated in FIG. 1). For illustration, an example top view of the semiconductor device 300 (without the ILD 900 being displayed) is shown in FIG. 17.

To form the cavity 1601, which is configured to remove the semiconductor fin structure 404B that functions as an inactive channel, at least some of the following operations may be performed: (i) forming a patterned mask over the workpiece that exposes a portion of the active gate structure 1000 overlaying the semiconductor fin structure 404B and a portion of the gate isolation structure 1400 (FIG. 14); (ii) performing a first etching process to remove the exposed portion of the active gate structure 1000 and the exposed portion of the gate isolation structure 1400 (thereby exposing the semiconductor fin structure 404B); (iii) performing a second etching process to remove an upper portion of the semiconductor fin structure 404B (e.g., the portion located above the top surface of the STI region 500); and (iv) performing a third etching process to remove a lower portion of the semiconductor fin structure 404B (e.g., the portion located below the top surface of the STI region 500) and a portion of the substrate 302 (e.g., the portion located below a bottom surface of the STI region 500). Such a series of operations to remove an inactive channel may sometimes be referred to as a Cut Poly Oxide Diffusion Edge (CPODE) process.

With the gate isolation structure 1400 (FIG. 14) having the wider upper portion, etchants used in the CPODE process (e.g., chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), etc.) cannot easily penetrate through the gate isolation structure 1400. As such, damage to the portion of the active gate structure 1000 that overlays the semiconductor fin structure 404A (which functions as an active channel) can be minimized, which can well reserve its dimensions and profiles.

In various embodiments, a portion of the gate isolation structure 1400' may remain, as shown in FIG. 16. For example, the remaining gate isolation structure 1400' can have one sidewall that contacts the remaining portion of the active gate structure 1000 reserved (i.e., unexposed), and the other sidewall exposed in the cavity 1601. As such, the unexposed sidewall can still tilt toward the remaining portion of the active gate structure 1000, and the exposed sidewall may also tilt toward the remaining portion of the active gate structure 1000. In some embodiments, the sidewalls of the remaining gate isolation structure 1400' may be in parallel with each other. It should be understood that the exposed sidewall may be formed in any of various other profiles (e.g., nearly perpendicular to the top surface of the STI region 500, tilted away from the remaining portion of the active gate structure 1000, etc.), while remaining within the scope of the present disclosure. In some embodiments, the remaining gate isolation structure 1400' can have a uniform thickness, as shown in FIG. 16. Alternatively stated, a distance between the sidewalls of the remaining gate isolation structure 1400' may remain the same, with the increasing height of the remaining gate isolation structure 1400'.

Figure 18:
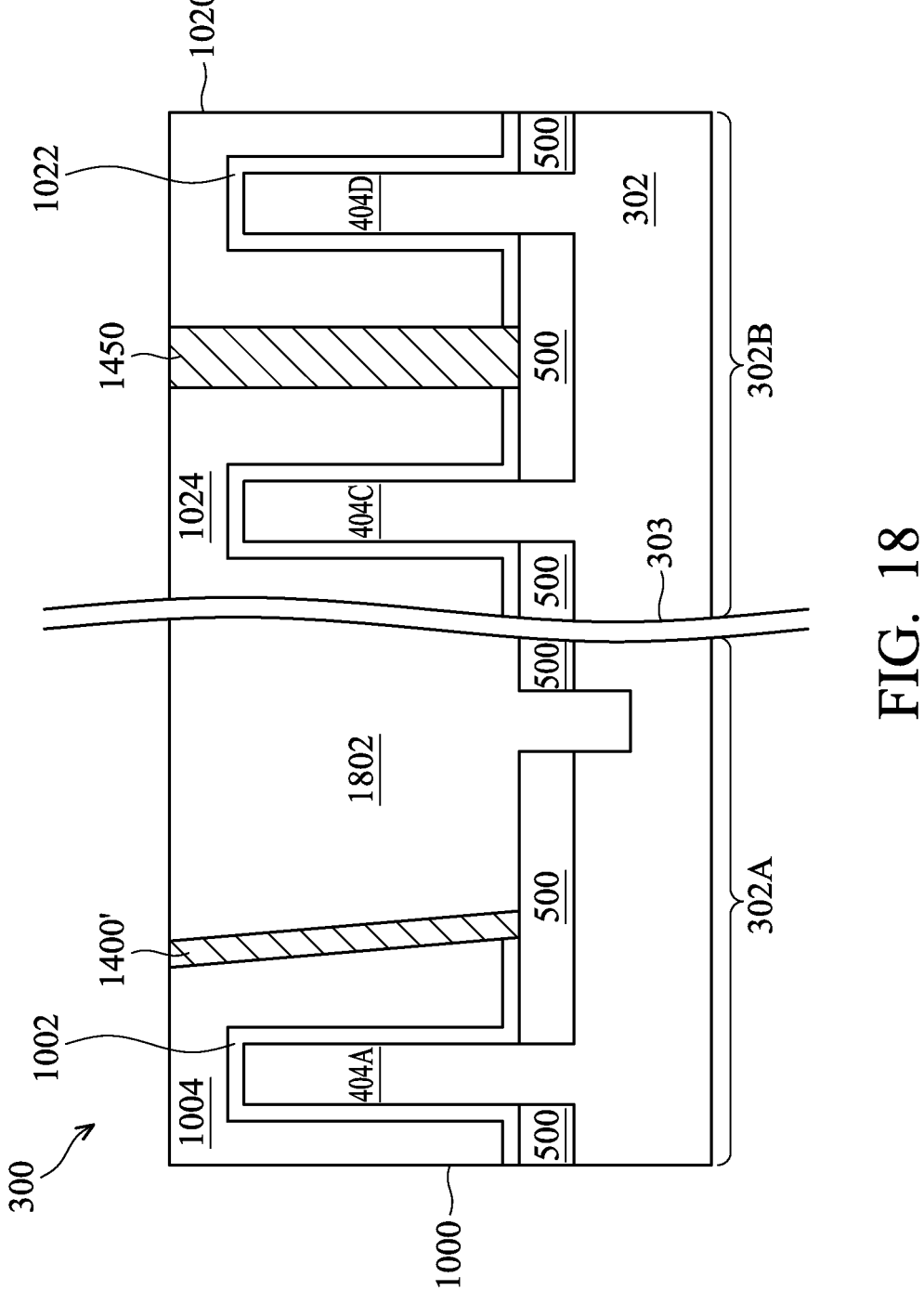
Figure 19:
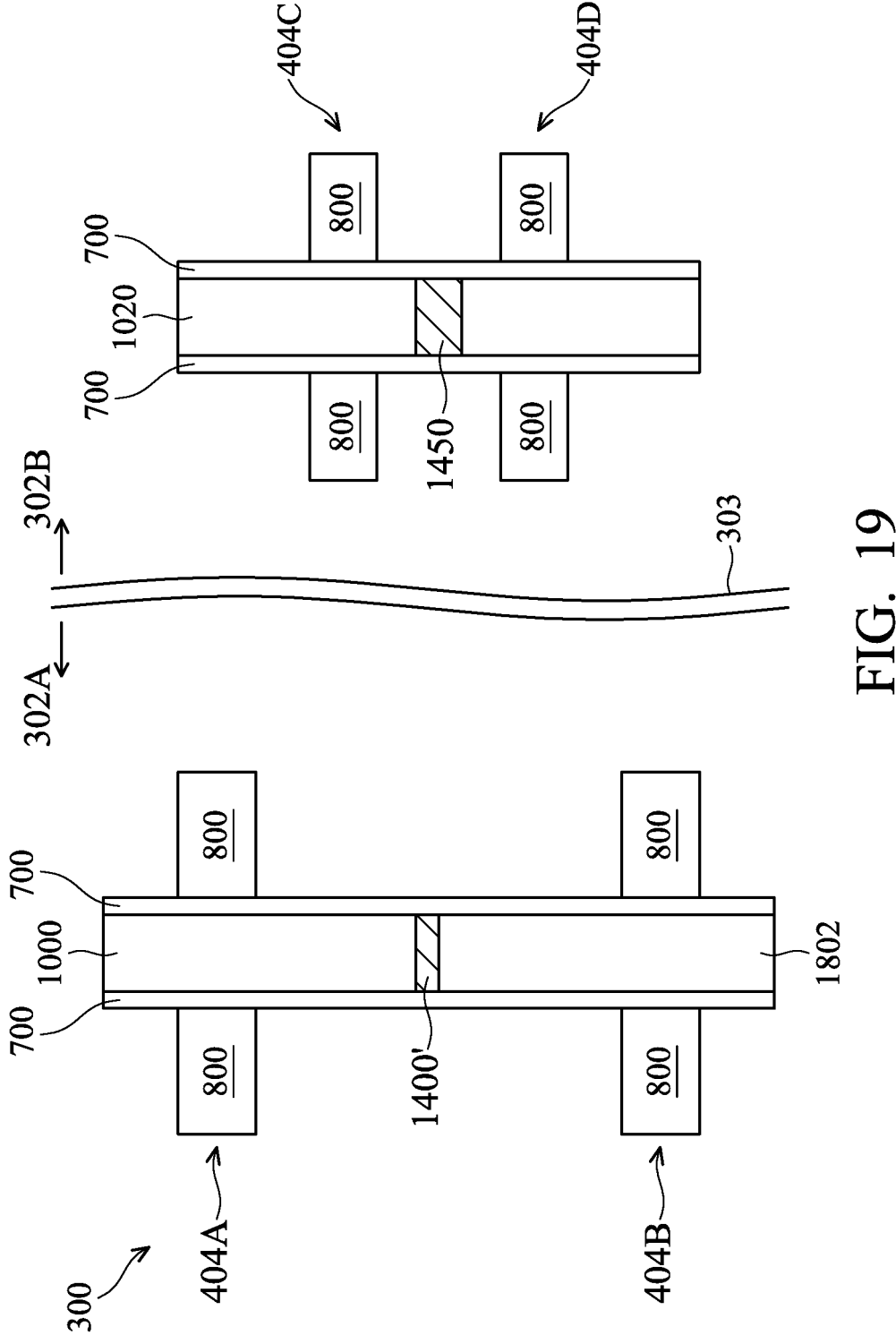

Corresponding to operation 224 of FIG. 2, FIG. 18 is a cross-sectional view of the semiconductor device 300 in which the cavity 1601 (FIG. 16) is filled with a dielectric refill material 1802 at one of the various stages of fabrication. The cross-sectional view of FIG. 18 is cut along the lengthwise direction of the active gate structures 1000 and 1020 of the semiconductor device 300 (e.g., cross-section B-B indicated in FIG. 1). For illustration, an example top view of the semiconductor device 300 (without the ILD 900 being displayed) is shown in FIG. 19.

In various embodiments, the dielectric refill material 1802 may be, for example, silicon oxide, silicon nitride, silicon oxynitride, silicon carbide, silicon carbonitride, silicon oxycarbonitride, silicon oxycarbide, multilayers thereof, or the like. The dielectric refill material 1802 can inherit the profiles and dimensions of the cavity 1601 (FIG. 16). For example, the dielectric refill material 1802 can extend through the STI region 500 and into the substrate 302; and the dielectric refill material 1802 can contact the sidewall of the remaining gate isolation structure 1400' that was exposed in the cavity 1601. In some embodiments, the dielectric refill material 1802 filling the cavity 1601 can electrically disconnect or otherwise isolate neighboring transistors, which is sometimes referred to as an "edge isolation structure 1802."

In one aspect of the present disclosure, a method for fabricating semiconductor devices is disclosed. The method includes forming a first semiconductor channel structure and a second semiconductor channel structure over a substrate that both extend along a first direction. The method includes forming a metal gate structure that extends along a second direction perpendicular to the first direction, wherein the metal gate structure includes a first portion and a second portion straddling the first semiconductor channel structure and the second semiconductor channel structure, respectively. The method includes replacing a third portion of the metal gate structure between the first portion and the second portion with a first dielectric material to form a gate isolation structure, wherein a width of the gate isolation structure along the second direction decreases with an increasing depth of the gate isolation structure toward the substrate. The method includes replacing a portion of the gate isolation structure, the second portion of the metal gate structure, and the second semiconductor channel structure with a second dielectric material to form an edge isolation structure.

In another aspect of the present disclosure, a method for fabricating semiconductor devices is disclosed. The method includes forming a first semiconductor channel structure and a second semiconductor channel structure over a first area of a substrate. The method includes forming a third semiconductor channel structure and a fourth semiconductor channel structure over a second area of the substrate, wherein the first to fourth semiconductor channel structures all extend along a first direction. The method includes forming a first metal gate structure that extends along a second direction perpendicular to the first direction to straddle the first semiconductor channel structure and the second semiconductor channel structure. The method includes forming a second metal gate structure that extends along the second direction to straddle the third semiconductor channel structure and the fourth semiconductor channel structure. The method includes replacing a portion of the first metal gate structure interposed between the first and second semiconductor channel structures with a first gate isolation structure, wherein a width of the first gate isolation structure along the second direction decreases with an increasing depth of the first gate isolation structure toward the substrate. The method includes replacing a portion of the second metal gate structure interposed between the third and fourth semiconductor channel structures with a second gate isolation structure, wherein a width of the second gate isolation structure along the second direction remains constant with an increasing depth of the second gate isolation structure toward the substrate.

In yet another aspect of the present disclosure, a method for fabricating semiconductor devices is disclosed. The method includes forming a first semiconductor channel structure and a second semiconductor channel structure over a first area of a substrate. The method includes forming a third semiconductor channel structure and a fourth semiconductor channel structure over a second area of the substrate, wherein the first to fourth semiconductor channel structures all extend along a first direction. The method includes forming a first metal gate structure that extends along a second direction perpendicular to the first direction to straddle the first semiconductor channel structure and the second semiconductor channel structure. The method includes forming a second metal gate structure that extends along the second direction to straddle the third semiconductor channel structure and the fourth semiconductor channel structure. The method includes forming a first gate isolation structure by replacing a portion of the first metal gate structure interposed between the first and second semiconductor channel structures, wherein a width of the first gate isolation structure along the second direction decreases with an increasing depth of the first gate isolation structure toward the substrate. The method includes forming a second gate isolation structure by replacing a portion of the second metal gate structure interposed between the third and fourth semiconductor channel structures, wherein a width of the second gate isolation structure along the second direction remains constant with an increasing depth of the second gate isolation structure toward the substrate. The method includes forming an edge isolation structure by replacing another portion of the first metal gate structure straddling the second semiconductor channel structure, a portion of the first gate isolation structure, and the second semiconductor channel structure with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating semiconductor devices, comprising:
forming a first semiconductor channel structure and a second semiconductor channel structure over a substrate that both extend along a first direction;
forming a metal gate structure that extends along a second direction perpendicular to the first direction, wherein the metal gate structure includes a first portion and a second portion straddling the first semiconductor channel structure and the second semiconductor channel structure, respectively;
replacing a third portion of the metal gate structure between the first portion and the second portion with a first dielectric material to form a gate isolation structure, wherein a width of the gate isolation structure along the second direction decreases with an increasing depth of the gate isolation structure toward the substrate; and
replacing a portion of the gate isolation structure, the second portion of the metal gate structure, and the second semiconductor channel structure with a second dielectric material to form an edge isolation structure.

2. The method of claim 1, wherein a remaining portion of the gate isolation structure has a first sidewall and a second sidewall in contact with the first portion of the metal gate structure and the edge isolation structure, respectively.

3. The method of claim 2, wherein each of the first sidewall and the second sidewall is tilted toward the first portion of the metal gate structure.

4. The method of claim 3, wherein an angle between any of the first sidewall or the second sidewall and a major top surface of the substrate is in a range from about 60 degrees to about 80 degrees.

5. The method of claim 3, wherein the first sidewall and the second sidewall are substantially in parallel with each other.

6. The method of claim 1, wherein the edge isolation has a sidewall in contact with a remaining portion of the gate isolation structure that is tilted toward the first portion of the metal gate structure.

7. The method of claim 1, further comprising:
forming a shallow trench isolation structure interposed between respective lower portions of the first semiconductor channel structure and the second semiconductor channel structure.

8. The method of claim 7, wherein the step of replacing a third portion of the metal gate structure between the first portion and the second portion with a first dielectric material to form a gate isolation structure further comprises:
removing the third portion of the metal gate structure until a top surface of the shallow trench isolation structure is exposed to form a trench; and
filing the trench with the first dielectric material.

9. The method of claim 8, wherein a width of the trench along the second direction decreases with an increasing depth of the trench toward the substrate.

10. A method for fabricating semiconductor devices, comprising:
(a) forming, over a substrate, a first semiconductor channel structure and a second semiconductor channel structure;

(b) forming, over the substrate, a third semiconductor channel structure and a fourth semiconductor channel structure, wherein the first to fourth semiconductor channel structures all extend along a first direction;

(c) forming, over the substrate, a first metal gate structure that extends along a second direction perpendicular to the first direction to straddle the first semiconductor channel structure and the second semiconductor channel structure;

(d) forming, over the substrate, a second metal gate structure that extends along the second direction to straddle the third semiconductor channel structure and the fourth semiconductor channel structure;

(e) replacing a portion of the first metal gate structure interposed between the first and second semiconductor channel structures with a first gate isolation structure, wherein a width of the first gate isolation structure along the second direction decreases with an increasing depth of the first gate isolation structure toward the substrate; and (f) replacing a portion of the second metal gate structure interposed between the third and fourth semiconductor channel structures with a second gate isolation structure, wherein a width of the second gate isolation structure along the second direction remains constant with an increasing depth of the second gate isolation structure toward the substrate;

wherein the method further comprises forming an edge isolation structure by replacing another portion of the first metal gate structure straddling the second semiconductor channel structure, a portion of the first gate isolation structure, and the second semiconductor channel structure with a dielectric material.

11. The method of claim 10, wherein the first semiconductor channel structure, the second semiconductor channel structure, the first metal gate structure, and the first gate isolation structure are formed in a first area of the substrate, and wherein the third semiconductor channel structure, the fourth semiconductor channel structure, the second metal gate structure, and the second gate isolation structure are formed in a second area of the substrate.

12. The method of claim 11, wherein a first density of transistors formed in the first area is less than a second density of transistors formed in the second area.

13. The method of claim 10, wherein the edge isolation structure has a sidewall in contact with a remaining portion of the first gate isolation structure that is tilted toward the first semiconductor channel structure.

14. The method of claim 13, wherein the remaining portion of the first gate isolation structure has its first and second sidewalls in contact with yet another portion of the first metal gate structure straddling the first semiconductor channel structure and the edge isolation structure, respectively, and wherein the first and second sidewalls are both tilted toward the first semiconductor channel structure.

15. The method of claim 14, wherein the first and second sidewalls are substantially in parallel with each other.

16. The method of claim 14, wherein an angle between any of the first sidewall or the second sidewall and a major top surface of the substrate is in a range from about 60 degrees to about 80 degrees.

17. The method of claim 10, wherein the step (e) and step (f) are concurrently performed.

18. A method for fabricating semiconductor devices, comprising:

(a) forming a first semiconductor channel structure and a second semiconductor channel structure over a first area of a substrate;

(b) forming a third semiconductor channel structure and a fourth semiconductor channel structure over a second area of the substrate, wherein the first to fourth semiconductor channel structures all extend along a first direction;

(c) forming a first metal gate structure that extends along a second direction perpendicular to the first direction to straddle the first semiconductor channel structure and the second semiconductor channel structure;

(d) forming a second metal gate structure that extends along the second direction to straddle the third semiconductor channel structure and the fourth semiconductor channel structure;

(e) forming a first gate isolation structure by replacing a portion of the first metal gate structure interposed between the first and second semiconductor channel structures, wherein a width of the first gate isolation structure along the second direction decreases with an increasing depth of the first gate isolation structure toward the substrate;

(f) forming a second gate isolation structure by replacing a portion of the second metal gate structure interposed between the third and fourth semiconductor channel structures, wherein a width of the second gate isolation structure along the second direction remains constant with an increasing depth of the second gate isolation structure toward the substrate; and (g) forming an edge isolation structure by replacing another portion of the first metal gate structure straddling the second semiconductor channel structure, a portion of the first gate isolation structure, and the second semiconductor channel structure with a dielectric material.

19. The method of claim 18, wherein a first density of transistors formed in the first area is less than a second density of transistors formed in the second area.

20. The method of claim 18, wherein a remaining portion of the first gate isolation structure has its first and second sidewalls substantially in parallel with each other.

* * * * *